(12) United States Patent
Toyotaka et al.

(10) Patent No.: US 10,256,255 B2
(45) Date of Patent: Apr. 9, 2019

(54) SEMICONDUCTOR DEVICE

(71) Applicant: Semiconductor Energy Laboratory Co., Ltd., Atsugi-shi, Kanagawa-ken (JP)

(72) Inventors: Kouhei Toyotaka, Kanagawa (JP); Jun Koyama, Kanagawa (JP); Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 188 days.

(21) Appl. No.: 15/239,006

(22) Filed: Aug. 17, 2016

(65) Prior Publication Data
US 2016/0365359 A1 Dec. 15, 2016

Related U.S. Application Data

(63) Continuation of application No. 14/315,601, filed on Jun. 26, 2014, now Pat. No. 9,424,950.

(30) Foreign Application Priority Data

Jul. 10, 2013 (JP) .................................. 2013-144190

(51) Int. Cl.
*G11C 19/00* (2006.01)
*H01L 27/12* (2006.01)
(Continued)

(52) U.S. Cl.
CPC .......... *H01L 27/124* (2013.01); *G02F 1/1334* (2013.01); *G02F 1/1337* (2013.01);
(Continued)

(58) Field of Classification Search
None
See application file for complete search history.

(56) References Cited

U.S. PATENT DOCUMENTS 5,701,136 A 12/1997 Huq et al.
5,731,856 A 3/1998 Kim et al.
(Continued)

FOREIGN PATENT DOCUMENTS

EP 1737044 A 12/2006
EP 1906414 A 4/2008
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Tuan T Lam
(74) *Attorney, Agent, or Firm* — Fish & Richardson P.C.

(57) ABSTRACT

A semiconductor device includes first and second transistors having the same conductivity type and a circuit. One of a source and a drain of the first transistor is electrically connected to that of the second transistor. First and third potentials are supplied to the circuit through respective wirings. A second potential and a first clock signal are supplied to the others of the sources and the drains of the first and second transistors, respectively. A second clock signal is supplied to the circuit. The third potential is higher than the second potential which is higher than the first potential. A fourth potential is equal to or higher than the third potential. The first clock signal alternates the second and fourth potentials and the second clock signal alternates the first and third potentials. The circuit controls electrical connections between gates of the first and second transistors and the wirings.

7 Claims, 16 Drawing Sheets

(51) Int. Cl.

| | | |
|---|---|---|
| *G11C 19/28* | (2006.01) | |
| *G02F 1/1334* | (2006.01) | |
| *G02F 1/1337* | (2006.01) | |
| *G02F 1/1343* | (2006.01) | |
| *G02F 1/1362* | (2006.01) | |
| *G02F 1/1368* | (2006.01) | |
| *G09G 3/3233* | (2016.01) | |
| *G09G 3/3258* | (2016.01) | |
| *G09G 3/36* | (2006.01) | |
| *H01L 29/786* | (2006.01) | |
| *G09G 3/3266* | (2016.01) | |
| *G09G 3/3275* | (2016.01) | |

(52) U.S. Cl.
 CPC ...... *G02F 1/1368* (2013.01); *G02F 1/134336* (2013.01); *G02F 1/136286* (2013.01); *G09G 3/3233* (2013.01); *G09G 3/3258* (2013.01); *G09G 3/3648* (2013.01); *G11C 19/28* (2013.01); *G11C 19/287* (2013.01); *H01L 27/1225* (2013.01); *H01L 29/7869* (2013.01); *G02F 2201/121* (2013.01); *G02F 2201/123* (2013.01); *G09G 3/3266* (2013.01); *G09G 3/3275* (2013.01); *G09G 3/3677* (2013.01); *G09G 3/3688* (2013.01); *G09G 2300/0426* (2013.01); *G09G 2310/0286* (2013.01); *G09G 2310/08* (2013.01); *G09G 2320/0626* (2013.01); *G09G 2330/021* (2013.01)

(56) References Cited

U.S. PATENT DOCUMENTS

| | | | |
|---|---|---|---|
| 5,744,864 A | | 4/1998 | Cillessen et al. |
| 5,859,630 A | | 1/1999 | Huq |
| 5,949,398 A | * | 9/1999 | Kim .................. G11C 19/28 345/100 |
| 6,121,797 A | | 9/2000 | Song et al. |
| 6,294,274 B1 | | 9/2001 | Kawazoe et al. |
| 6,563,174 B2 | | 5/2003 | Kawasaki et al. |
| 6,727,522 B1 | | 4/2004 | Kawasaki et al. |
| 6,813,332 B2 | * | 11/2004 | Nagao .................. G11C 19/28 345/100 |
| 6,928,135 B2 | * | 8/2005 | Sasaki .................. G11C 8/04 345/100 |
| 7,049,190 B2 | | 5/2006 | Takeda et al. |
| 7,061,014 B2 | | 6/2006 | Hosono et al. |
| 7,064,346 B2 | | 6/2006 | Kawasaki et al. |
| 7,105,868 B2 | | 9/2006 | Nause et al. |
| 7,116,748 B2 | | 10/2006 | Nagao et al. |
| 7,211,825 B2 | | 5/2007 | Shih et al. |
| 7,282,782 B2 | | 10/2007 | Hoffman et al. |
| 7,297,977 B2 | | 11/2007 | Hoffman et al. |
| 7,317,780 B2 | | 1/2008 | Lin et al. |
| 7,323,356 B2 | | 1/2008 | Hosono et al. |
| 7,333,586 B2 | * | 2/2008 | Jang .................. G09G 3/3677 377/64 |
| 7,352,839 B2 | | 4/2008 | Yu |
| 7,369,111 B2 | | 5/2008 | Jeon et al. |
| 7,385,224 B2 | | 6/2008 | Ishii et al. |
| 7,402,506 B2 | | 7/2008 | Levy et al. |
| 7,411,209 B2 | | 8/2008 | Endo et al. |
| 7,453,065 B2 | | 11/2008 | Saito et al. |
| 7,453,087 B2 | | 11/2008 | Iwasaki |
| 7,462,862 B2 | | 12/2008 | Hoffman et al. |
| 7,468,304 B2 | | 12/2008 | Kaji et al. |
| 7,486,269 B2 | | 2/2009 | Moon |
| 7,501,293 B2 | | 3/2009 | Ito et al. |
| 7,674,650 B2 | | 3/2010 | Akimoto et al. |
| 7,732,819 B2 | | 6/2010 | Akimoto et al. |
| 7,796,109 B2 | | 9/2010 | Mamba et al. |
| 7,859,510 B2 | | 12/2010 | Umezaki |
| 7,907,113 B2 | * | 3/2011 | Jang .................. G09G 3/3607 345/100 |
| 7,932,888 B2 | | 4/2011 | Miyake |
| 7,949,085 B2 | * | 5/2011 | Cheng .................. G09G 3/3677 345/100 |
| 7,978,274 B2 | | 7/2011 | Umezaki et al. |
| 7,983,379 B2 | | 7/2011 | Ieong et al. |
| 8,054,279 B2 | | 11/2011 | Umezaki et al. |
| 8,085,235 B2 | | 12/2011 | Jeon et al. |
| 8,089,445 B2 | | 1/2012 | Shin et al. |
| 8,107,586 B2 | | 1/2012 | Shin et al. |
| 8,109,039 B2 | | 2/2012 | Kruger et al. |
| 8,175,215 B2 | | 5/2012 | Liu et al. |
| 8,278,974 B2 | | 10/2012 | Takahashi et al. |
| 8,320,516 B2 | * | 11/2012 | Toyotaka ............. G11C 19/184 377/64 |
| 8,442,183 B2 | * | 5/2013 | Amano ................ G11C 19/184 377/64 |
| 8,456,396 B2 | | 6/2013 | Umezaki |
| 8,462,100 B2 | | 6/2013 | Umezaki |
| 8,582,715 B2 | | 11/2013 | Chung et al. |
| 8,743,044 B2 | | 6/2014 | Umezaki et al. |
| 8,867,697 B2 | * | 10/2014 | Jang .................. G09G 3/3677 377/64 |
| 8,902,145 B2 | | 12/2014 | Umezaki et al. |
| 9,001,959 B2 | | 4/2015 | Koyama |
| 9,117,537 B2 | | 8/2015 | Amano et al. |
| 9,536,903 B2 | | 1/2017 | Umezaki et al. |
| 9,543,039 B2 | | 1/2017 | Amano et al. |
| 9,842,861 B2 | | 12/2017 | Umezaki et al. |
| 2001/0046027 A1 | | 11/2001 | Tai et al. |
| 2002/0056838 A1 | | 5/2002 | Ogawa |
| 2002/0132454 A1 | | 9/2002 | Ohtsu et al. |
| 2003/0189401 A1 | | 10/2003 | Kido et al. |
| 2003/0218222 A1 | | 11/2003 | Wager, III et al. |
| 2004/0038446 A1 | | 2/2004 | Takeda et al. |
| 2004/0127038 A1 | | 7/2004 | Carcia et al. |
| 2005/0017302 A1 | | 1/2005 | Hoffman |
| 2005/0199959 A1 | | 9/2005 | Chiang et al. |
| 2006/0035452 A1 | | 2/2006 | Carcia et al. |
| 2006/0043377 A1 | | 3/2006 | Hoffman et al. |
| 2006/0091793 A1 | | 5/2006 | Baude et al. |
| 2006/0108529 A1 | | 5/2006 | Saito et al. |
| 2006/0108636 A1 | | 5/2006 | Sano et al. |
| 2006/0110867 A1 | | 5/2006 | Yabuta et al. |
| 2006/0113536 A1 | | 6/2006 | Kumomi et al. |
| 2006/0113539 A1 | | 6/2006 | Sano et al. |
| 2006/0113549 A1 | | 6/2006 | Den et al. |
| 2006/0113565 A1 | | 6/2006 | Abe et al. |
| 2006/0169973 A1 | | 8/2006 | Isa et al. |
| 2006/0170111 A1 | | 8/2006 | Isa et al. |
| 2006/0197092 A1 | | 9/2006 | Hoffman et al. |
| 2006/0208977 A1 | | 9/2006 | Kimura |
| 2006/0220587 A1 | | 10/2006 | Tobita et al. |
| 2006/0228974 A1 | | 10/2006 | Thelss et al. |
| 2006/0231882 A1 | | 10/2006 | Kim et al. |
| 2006/0238135 A1 | | 10/2006 | Kimura |
| 2006/0244107 A1 | | 11/2006 | Sugihara et al. |
| 2006/0284171 A1 | | 12/2006 | Levy et al. |
| 2006/0284172 A1 | | 12/2006 | Ishii |
| 2006/0292777 A1 | | 12/2006 | Dunbar |
| 2007/0024187 A1 | | 2/2007 | Shin et al. |
| 2007/0046191 A1 | | 3/2007 | Saito |
| 2007/0052025 A1 | | 3/2007 | Yabuta |
| 2007/0054507 A1 | | 3/2007 | Kaji et al. |
| 2007/0086558 A1 | | 4/2007 | Wei et al. |
| 2007/0090365 A1 | | 4/2007 | Hayashi et al. |
| 2007/0108446 A1 | | 5/2007 | Akimoto |
| 2007/0152217 A1 | | 7/2007 | Lai et al. |
| 2007/0172591 A1 | | 7/2007 | Seo et al. |
| 2007/0187678 A1 | | 8/2007 | Hirao et al. |
| 2007/0187760 A1 | | 8/2007 | Furuta et al. |
| 2007/0194379 A1 | | 8/2007 | Hosono et al. |
| 2007/0252928 A1 | | 11/2007 | Ito et al. |
| 2007/0272922 A1 | | 11/2007 | Kim et al. |
| 2007/0287296 A1 | | 12/2007 | Chang |
| 2008/0006877 A1 | | 1/2008 | Mardilovich et al. |
| 2008/0038882 A1 | | 2/2008 | Takechi et al. |
| 2008/0038929 A1 | | 2/2008 | Chang |
| 2008/0050595 A1 | | 2/2008 | Nakagawara et al. |
| 2008/0073653 A1 | | 3/2008 | Iwasaki |

(56) References Cited

U.S. PATENT DOCUMENTS

| | | |
|---|---|---|
| 2008/0079685 A1 | 4/2008 | Umezaki et al. |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0084651 A1 | 4/2010 | Yamazaki et al. |
| 2010/0092800 A1 | 4/2010 | Itagaki et al. |
| 2010/0109002 A1 | 5/2010 | Itagaki et al. |
| 2010/0134476 A1 | 6/2010 | Zebedee et al. |
| 2011/0084960 A1 | 4/2011 | Miyake et al. |
| 2011/0193622 A1 | 8/2011 | Miyake |
| 2011/0255652 A1 | 10/2011 | Yang et al. |
| 2011/0260169 A1 | 10/2011 | Umezaki et al. |
| 2011/0285675 A1 | 11/2011 | Amano et al. |
| 2012/0049184 A1 | 3/2012 | Umezaki et al. |
| 2012/0056860 A1 | 3/2012 | Umezaki et al. |
| 2012/0163528 A1 | 6/2012 | Jang et al. |
| 2013/0010916 A1 | 1/2013 | Jang et al. |
| 2013/0049133 A1* | 2/2013 | Koyama ............. H01L 27/1225 257/390 |
| 2013/0322592 A1* | 12/2013 | Miyake ................ G11C 19/184 377/64 |
| 2014/0023173 A1 | 1/2014 | Miyake |
| 2014/0044228 A1* | 2/2014 | Jang ........................ G11C 19/00 377/64 |
| 2015/0116194 A1* | 4/2015 | Matsui ................ G09G 3/3266 345/100 |
| 2017/0148408 A1 | 5/2017 | Amano et al. |
| 2018/0158839 A1 | 6/2018 | Umezaki et al. |

FOREIGN PATENT DOCUMENTS

| | | | |
|---|---|---|---|
| EP | 2226847 | A | 9/2010 |
| EP | 3223283 | A | 9/2017 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-224629 | A | 9/1993 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2001-325798 | A | 11/2001 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2005-123865 | A | 5/2005 |
| JP | 2008-089915 | A | 4/2008 |
| JP | 2008-140490 | A | 6/2008 |
| JP | 2010-527092 | | 8/2010 |
| JP | 2010-277652 | A | 12/2010 |
| JP | 2012-009125 | A | 1/2012 |
| JP | 2013-066172 | A | 4/2013 |
| TW | I316219 | | 10/2009 |
| TW | 201220949 | | 5/2012 |
| WO | WO-2004/114391 | | 12/2004 |
| WO | WO-2009/028716 | | 3/2009 |
| WO | WO-2011/145666 | | 11/2011 |
| WO | WO-2013/031793 | | 3/2013 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors For High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

(56) References Cited

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven By Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 13, No. 3, pp. 339-342.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures For Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 16th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Wu.Z et al., "An Integrated Gate Driver Circuit Employing Depletion-Mode IGZO TFTs", SID Digest '12 : SID International Symposium Digest of Technical Papers, Jun. 1, 2012, vol. 43, No. 1, pp. 5-7.

Taiwanese Office Action (Application No. 107102753) dated May 16, 2018.

\* cited by examiner

SEMICONDUCTOR DEVICE

CROSS-REFERENCE TO RELATED APPLICATIONS

This application is a continuation of U.S. application Ser. No. 14/315,601, filed Jun. 26, 2014, now allowed, which claims the benefit of a foreign priority application filed in Japan as Serial No. 2013-144190 on Jul. 10, 2013, both of which are incorporated by reference.

BACKGROUND OF THE INVENTION

1. Field of the Invention

One embodiment of the present invention relates to a semiconductor device. In particular, one embodiment of the present invention relates to a semiconductor device such as a sequential circuit that includes transistors having the same conductivity type and a semiconductor display device that includes the sequential circuit.

2. Description of the Related Art

A semiconductor display device in which a driver circuit is constituted of transistors having the same conductivity type is preferable because the manufacturing cost can be lowered. Patent Documents 1 and 2 disclose techniques for forming a variety of circuits such as inverters and shift registers that are used in driver circuits of semiconductor display devices and are constituted of transistors having the same conductivity type.

REFERENCE

Patent Document

[Patent Document 1] Japanese Published Patent Application No. 2001-325798
[Patent Document 2] Japanese Published Patent Application No. 2010-277652

SUMMARY OF THE INVENTION

Transistors having the same conductivity type tend to be normally on because the threshold voltages are likely to be shifted in the negative direction on account of various factors. In a driver circuit of a semiconductor display device constituted of transistors having the same conductivity type, when the threshold voltages of the transistors are shifted in the negative direction in sequential circuits that output signals having pulses, the amplitude of potentials of the output signals becomes small and the driver circuit cannot be normally operated; alternatively, even if normal operation is carried out, the power consumption of the driver circuit is increased.

For example, in a circuit disclosed in FIG. 10 of Patent Document 2, the potential of a source of a transistor Q2 is fixed to a low potential VSS. If the transistor Q2 is normally off, the transistor Q2 is turned off when the low potential VSS is supplied to a gate of the transistor Q2. If the transistor Q2 is normally on, even when the low potential VSS is supplied to the gate of the transistor Q2, the voltage (gate voltage) between the gate and the source when the potential of the source is a reference is kept higher than the threshold voltage of the transistor Q2. Thus, the transistor Q2 is not turned off but is turned on.

When the transistor Q2 is on though it should be off, wasted current flows to the circuit, so that consumption current is increased. Further, the wasted current increases current flowing to a wiring for supplying a potential (e.g., in the case of FIG. 10 of Patent Document 2, the low-level potential VSS and a high-level potential VDD of a clock signal CLKA or the low-level potential VSS) to the circuit. Then, the resistance of the wiring decreases the potential of the wiring supplied with the potential VDD and increases the potential of the wiring supplied with the potential VSS. Accordingly, the amplitude of a potential output from the circuit is smaller than a difference between the potentials VDD and VSS (an ideal potential difference).

In the case where a transistor for controlling electrical connection between a wiring to which a clock signal is supplied and an output terminal (e.g., the transistor Q1 in FIG. 10 of Patent Document 2) is normally on, the output terminal is charged and discharged through the transistor Q1, which increases the power consumption of the circuit.

In particular, in a pixel portion of a semiconductor display device, when a potential output from a circuit is supplied to a wiring called a bus line (e.g., a scan line or a signal line) that is connected to a plurality of pixels, a transistor for controlling the output of a potential from the circuit (e.g., the transistors Q1 and Q2 in FIG. 10 of Patent Document 2) needs a large current supply capability. Thus, the channel width W of the transistor is made larger than that of another transistor in the circuit in many cases. The drain current of the transistor is proportional to the channel width W. Thus, in the case where the channel width W of a normally-on transistor is made larger, the amount of current flowing to the normally-on transistor is larger than that of another transistor when the normally-on transistor should be off. Consequently, wasted current flowing to the circuit is increased, so that the aforementioned increase in power consumption or decrease in amplitude of a potential output remarkably occurs.

Under the technical background, it is an object of the present invention to provide a power saving semiconductor device. Alternatively, it is an object of the present invention to provide a semiconductor device capable of preventing a decrease in amplitude of a potential output.

One embodiment of the present invention includes a first transistor for controlling the supply of a power supply potential to an output terminal; a second transistor for controlling the supply of a potential of a clock signal to an output terminal; and a circuit for controlling electrical connection between a gate of the first or second transistor and wirings to which a pair of power supply potentials are supplied. A power supply potential supplied to the output terminal through a source and a drain of the first transistor is supplied to a sequential circuit through a wiring that is different from the wirings to which the pair of power supply potentials are supplied.

With such a configuration, the gate of the first transistor can be electrically isolated from one of the source and the drain of the first transistor. Thus, a power supply potential supplied to the one of the source and the drain of the first transistor and a power supply potential supplied to the gate of the first transistor are individually controlled, whereby its gate voltage can be controlled to turn off the first transistor. Accordingly, even when the first transistor is normally on, the first transistor can be turned off when it should be turned off.

In one embodiment of the present invention, in the case where the first and second transistors are n-channel transistors, one of two levels of potentials of the clock signal that is closer to the power supply potential supplied to the output terminal through the source and the drain of the first transistor has a potential that is equal to or higher than the power supply potential. In the case where the first and second transistors are p-channel transistors, one of two levels of potentials of the clock signal that is closer to the power supply potential supplied to the output terminal through the source and the drain of the first transistor has a potential that is equal to or lower than the power supply potential.

With such a configuration, even when the second transistor is normally on, the second transistor can be turned off when it should be turned off. Thus, the charge and discharge of the output terminal through the second transistor can be prevented, which can keep the power consumption of the circuit low.

Specifically, a semiconductor device of one embodiment of the present invention includes a first wiring to which a first potential (VSS) is supplied; a second wiring to which a second potential (VEE) higher than the first potential is supplied; a third wiring to which a third potential (VDD) higher than the second potential is supplied; a fourth wiring to which a first clock signal (CLKB) in which a fourth potential (VCC) that is equal to or higher than the third potential and the second potential are alternated is supplied; a first transistor and a second transistor having the same conductivity type; and a circuit for controlling electrical connection between a gate of the first or second transistor and the first or third wiring in accordance with a second clock signal in which the first potential and the third potential are alternated and an input signal (Vin). One of a source and a drain of the first transistor is electrically connected to the second wiring. One of a source and a drain of the second transistor is electrically connected to the fourth wiring. The other of the source and the drain of the first transistor is electrically connected to the other of the source and the drain of the second transistor.

In one embodiment of the present invention, it is possible to provide a power saving semiconductor device constituted of transistors having the same conductivity type. Alternatively, in one embodiment of the present invention, it is possible to provide a semiconductor device capable of preventing a decrease in amplitude of a potential output.

DETAILED DESCRIPTION OF THE INVENTION

Figure 1A:
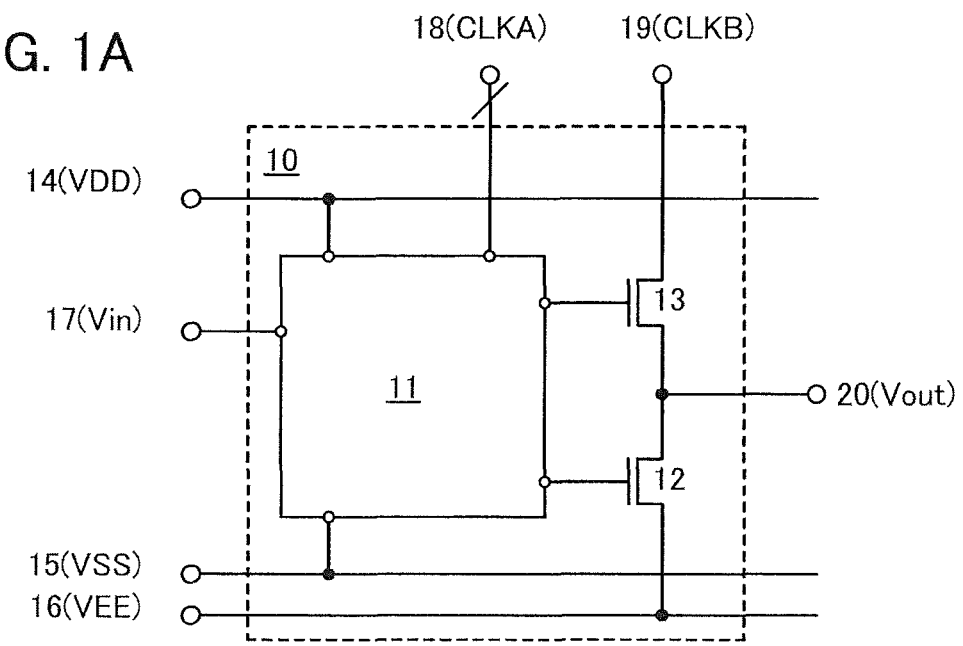
FIG. 1A illustrates a configuration of a sequential circuit and FIG. 1B shows waveforms of potentials of clock signals.

Embodiments of the present invention are described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

The present invention encompasses in its category, any semiconductor device using a transistor, such as an integrated circuit, an RF tag, and a semiconductor display device. The integrated circuits include, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). Further, the semiconductor display device includes, in its category, semiconductor display devices in which circuit elements including semiconductor films are included in driver circuits, such as liquid crystal display devices, light-emitting devices in which a light-emitting element typified by an organic light-emitting element is provided in each pixel, electronic paper, digital micromirror devices (DMDs), plasma display panels (PDPs), and field emission displays (FEDs).

In this specification, the semiconductor display device includes in its category, panels in which a display element such as a liquid crystal element or a light-emitting element is provided for each pixel, and modules in which an IC or the like including a controller is mounted on the panel.

Note that "connection" in this specification means electrical connection and corresponds to the state in which current, voltage, or a potential can be supplied or transmitted. Accordingly, a connection state means not only a state of direct connection but also a state of electrical connection through a circuit element such as a wiring, a resistor, a diode, or a transistor so that current, voltage, or a potential can be supplied or transmitted.

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the type of the channel of the transistor or levels of potentials supplied to the terminals. In general, in an n-channel transistor, a terminal to which a lower potential is supplied is called a source, and a terminal to which a higher potential is supplied is called a drain. Further, in a p-channel transistor, a terminal to which a lower potential is supplied is called a drain, and a terminal to which a higher potential is supplied is called a source. In this specification, although connection relation of the transistor is described assuming that the source and the drain are fixed in some cases for convenience, actually, the names of the source and the drain interchange with each other depending on the relation of the potentials.

<Configuration Examples of Sequential Circuit>

FIG. 1A illustrates an example of the configuration of a sequential circuit in one embodiment of the present invention. A sequential circuit 10 in FIG. 1A includes a circuit 11 including a plurality of transistors, a transistor 12, and a transistor 13. In the sequential circuit 10 in FIG. 1A, at least the transistors 12 and 13 have the same conductivity type. In FIG. 1A, the transistors 12 and 13 are n-channel transistors.

A high-level power supply potential VDD is supplied to the circuit 11 through a wiring 14. A low-level power supply potential VSS is supplied to the circuit 11 through a wiring 15. A potential of an input signal Vin is supplied to the circuit 11 through a wiring 17. Potentials of a plurality of clock signals CLKA are supplied to the circuit 11 through a plurality of wirings 18.

The circuit 11 has a function of controlling electrical connection between a gate of the transistor 12 or 13 and the wiring 14 or 15 in accordance with the potential of the input signal Vin and the plurality of clock signals CLKA.

The transistor 12 has a function of controlling electrical connection between a wiring 16 to which a low-level power supply potential VEE is supplied and an output terminal 20. The transistor 13 has a function of controlling electrical connection between a wiring 19 to which a clock signal CLKB is supplied and the output terminal 20.

Specifically, one of a source and a drain of the transistor 12 is electrically connected to the wiring 16. The other of the source and the drain of the transistor 12 is electrically connected to the output terminal 20. One of a source and a drain of the transistor 13 is electrically connected to the wiring 19. The other of the source and the drain of the transistor 13 is electrically connected to the output terminal 20.

A capacitor having a function of holding a gate voltage of the transistor 13 may be connected to the gate of the transistor 13. Note that in the case where the gate voltage of the transistor 13 can be held without provision of the capacitor, for example, in the case where the parasitic capacitance of the gate of the transistor 13 is high, the capacitor is not necessarily provided.

When a potential Vout output from the output terminal 20 of the sequential circuit 10 is supplied to a wiring called a bus line that is connected to a plurality of pixels, the transistors 12 and 13 for controlling the output of the potential Vout needs a large current supply capability. Thus, the channel widths W of the transistors 12 and 13 are preferably greater than those of transistors in the circuit 11.

The power supply potential VEE is preferably lower than the power supply potential VDD and higher than the power supply potential VSS.

Figure 1B:
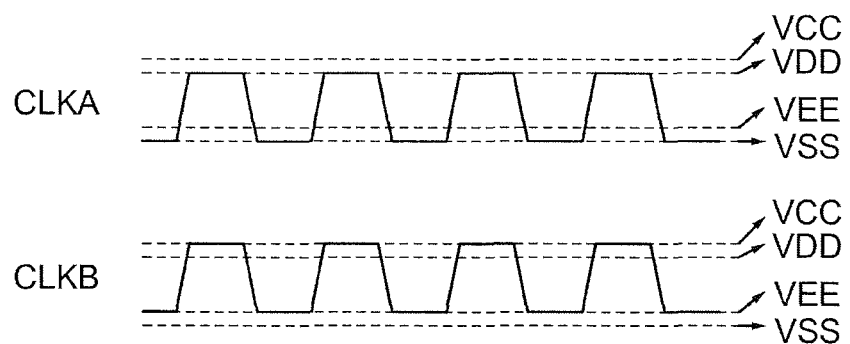

In one embodiment of the present invention, two levels of potentials are alternated in the clock signal CLKB, and a low-level potential of the two levels of potentials that is closer to the power supply potential VSS is equal to or higher than the power supply potential VEE. FIG. 1B exemplifies a waveform of a potential of a clock signal CLKA in which the power supply potential VSS and the power supply potential VDD are alternated and a waveform of a potential of a clock signal CLKB in which the power supply potential VEE and a power supply potential VCC higher than the power supply potential VDD are alternated. Although FIG. 1B exemplifies the case where the high-level potential of the clock signal CLKB is the power supply potential VCC that is higher than the power supply potential VDD, a potential that is equal to or higher than the power supply potential VDD is acceptable as the high-level potential of the clock signal CLKB.

In the case where the transistor 13 is an n-channel transistor, when a potential higher than the power supply potential VDD is supplied from the circuit 11 to the gate of the transistor 13, the high-level potential VCC of the clock signal CLKB that is supplied to the one of the source and the drain of the transistor 13 is supplied to the output terminal 20 through the transistor 13 in an on-state. Then, the power supply potential VSS is supplied from the circuit 11 to the gate of the transistor 13, and the low-level potential VEE of the clock signal CLKB is supplied to the one of the source and the drain of the transistor 13, so that the gate voltage of the transistor 13 is a potential VSS−VEE. Even if the transistor 13 is normally on, the transistor 13 can be turned off by setting the level of the potential VEE to satisfy VSS−VEE≤Vth; thus, an increase in power consumption due to charge and discharge of the wiring 18 through the transistor 13 can be prevented.

In the case where the transistor 12 is an n-channel transistor, the transistor 12 is turned on when the power supply potential VDD or a potential lower than the power supply potential VDD by the threshold voltage of the transistors provided in the circuit 11 is supplied from the circuit 11 to the gate of the transistor 12. When the power supply potential VSS is supplied from the circuit 11 to the gate of the transistor 12, a gate voltage Vgs is VSS−VEE. Even if the transistor 12 is normally on, the transistor 12 can be turned off by setting the level of the potential VEE to satisfy VSS−VEE≤Vth; thus, an increase in power consumption can be prevented.

When the transistors in the circuit 11 are normally on as well as the transistor 12, current flows in the wiring 15 through the transistors in the circuit 11, which raises the potential of the wiring 15. Since the potential of the wiring 15 is supplied to the gate of the transistor 12 through the circuit 11, due to the rise in potential of the wiring 15, the potential supplied to the gate of the transistor 12 is also raised from the power supply potential VSS to the potential VSS+Vα.

Even if the potential supplied to the gate of the transistor 12 is raised, the transistor 12 is kept off when the following formula is satisfied: Vgs=VSS+Vα−VEE≤Vth. Thus, when the levels of the power supply potentials VSS and VEE are set to satisfy Vgs≤Vth in anticipation of the amount of an increase in the potential of the wiring 15, even if the transistor 12 is normally on, the transistor 12 can be turned off when it should be turned off.

In the case where the potential Vout output from the output ten final 20 in the sequential circuit 10 is supplied to the wiring called a bus line that is connected to the plurality of pixels, a large current supply capability is needed for the transistors 12 and 13, and in contrast, the current supply capability of the transistors in the circuit 11 does not have to be as large as that of the transistors 12 and 13. Therefore, the channel widths W of the transistors in the circuit 11 can be smaller than those of the transistors 12 and 13. Accordingly, even if the transistors in the circuit 11 is normally on and the gate voltage is somewhat greater than the threshold voltage, current flowing in the wiring 15 through the transistors in the circuit 11 can be smaller than that flowing in the wiring 16 when the gate voltage of the transistor 12 is somewhat greater than the threshold voltage. Thus, it is relatively easy to keep a voltage Vα that corresponds to the amount of change in the potential of the wiring 15 small.

As described above, in the sequential circuit 10 of one embodiment of the present invention, the wiring 16 electrically connected to the one of the source and the drain of the transistor 12 that is positioned on an output side is electrically isolated from the wiring 15 electrically connected to the transistors in the circuit 11, whereby the power supply potential VEE supplied to the one of the source and the drain of the transistor 12 and the power supply potential VSS supplied to the gate of the transistor 12 can be individually controlled. Accordingly, even when the transistor 12 is normally on, the gate voltage of the transistor 12 can be controlled so that the transistor 12 can be turned off when it should be turned off. Thus, the power consumption of the sequential circuit 10 can be kept low; furthermore, the amplitude of the potential Vout output from the sequential circuit 10 is prevented from being small.

Note that although the transistors 12 and 13 are n-channel transistors in FIG. 1A, the transistors 12 and 13 may be p-channel transistors. Note that in such a case, a potential higher than the wiring 14 is supplied to the wiring 15 connected to the circuit 11 and supplied to the wiring 16 connected to the one of the source and the drain of the transistor 12. The potential of the wiring 16 is lower than that of the wiring 15.

<Specific Configuration Example 1 of Sequential Circuit>

Figure 2:
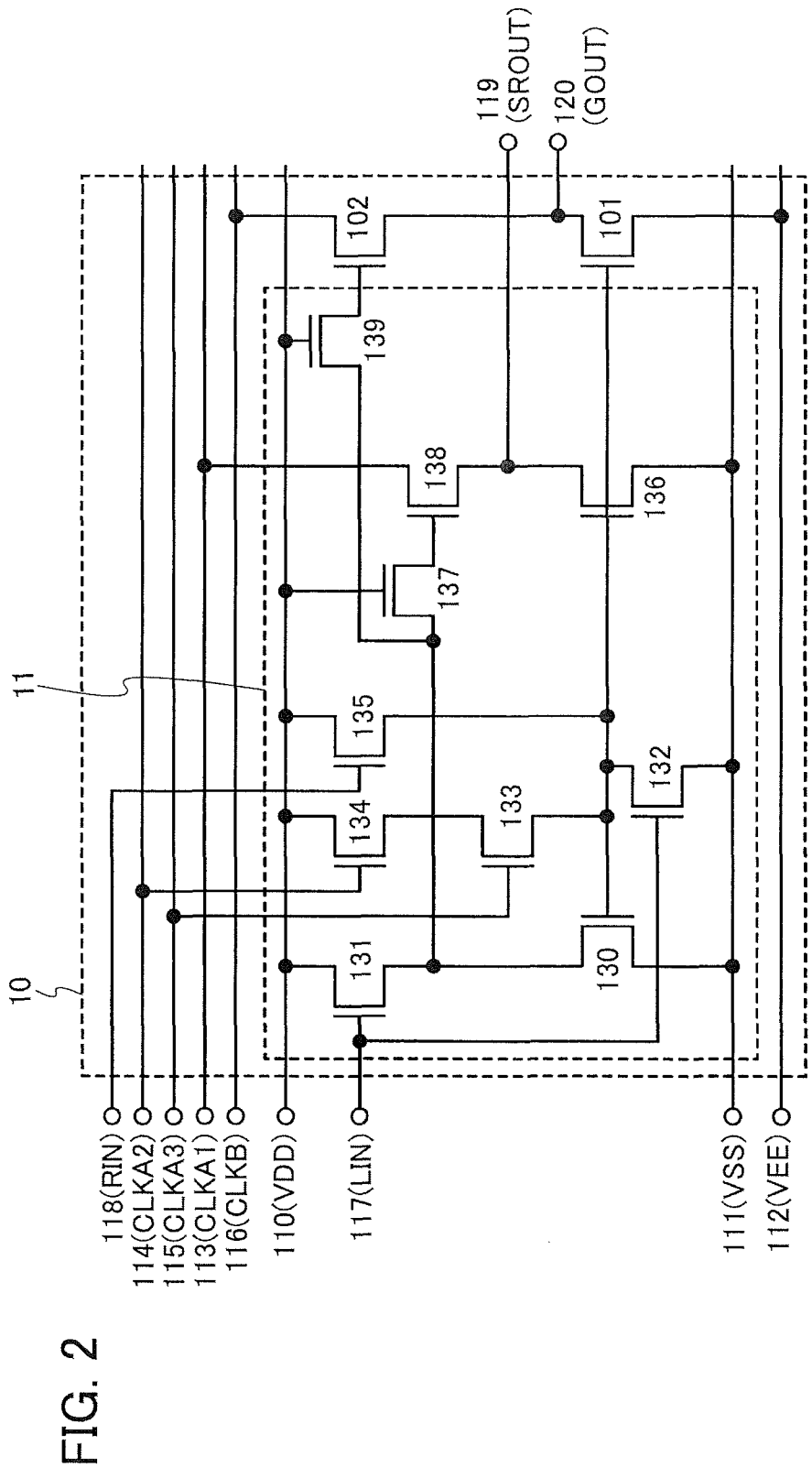
FIG. 2 illustrates a configuration of a sequential circuit.

Next, the specific structure example of the sequential circuit 10 is described. FIG. 2 illustrates an example of the configuration of a sequential circuit of one embodiment of the present invention.

The sequential circuit 10 in FIG. 2 includes the circuit 11, a transistor 101, and a transistor 102. The transistors 101 and 102 correspond to the transistors 12 and 13, respectively, in FIG. 1A. In the sequential circuit 10, a variety of power supply potentials are supplied through wirings 110, 111, and 112, and the clock signals CLKA1, CLKA2, and CLKA3 are supplied through wirings 113, 114, and 115, respectively. The clock signal CLKB is supplied through a wiring 116, an input signal LIN is supplied through a wiring 117, and an input signal RIN is supplied through a wiring 118. In the sequential circuit 10, an output signal SROUT is output through a wiring 119, and an output signal GOUT is output through a wiring 120.

In the sequential circuit 10 in FIG. 2, the circuit 11 includes transistors 130 to 139.

A shift register can be constituted by connecting the sequential circuits 10 in the plurality of stages to each other.

In the case where the transistors 101, 102, and 130 to 139 are n-channel transistors, specifically, the power supply potential VDD is supplied to the wiring 110, the power supply potential VSS is supplied to the wiring 111, and the power supply potential VEE is supplied to the wiring 112. In addition, the input signal LIN is supplied to the wiring 117, and the input signal RIN is supplied to the wiring 118. The input signal LIN and the input signal RIN correspond to the input signal Vin of the sequential circuit 10 in FIG. 1A.

A gate of the transistor 130 is connected to gates of the transistors 136 and 101. One of a source and a drain of the transistor 130 is connected to the wiring 111. The other of the source and the drain of the transistor 130 is connected to one of a source and a drain of the transistor 137 and one of a source and a drain of the transistor 139. One of a source and a drain of the transistor 136 is connected to the wiring 111, and the other of the source and the drain of the transistor 136 is connected to the wiring 119. One of a source and a drain of the transistor 101 is connected to the wiring 112, and the other of the source and the drain of the transistor 101 is connected to the wiring 120.

A gate of the transistor 131 is connected to the wiring 117. One of a source and a drain of the transistor 131 is connected to the wiring 110. The other of the source and the drain of the transistor 131 is connected to the other of a source and the drain of the transistor 130. A gate of the transistor 134 is connected to the wiring 114. One of a source and a drain of the transistor 134 is connected to the wiring 110. The other of the source and the drain of the transistor 134 is connected to one of a source and a drain of the transistor 133. A gate of the transistor 135 is connected to the wiring 118. One of a source and a drain of the transistor 135 is connected to the wiring 110. The other of the source and the drain of the transistor 135 is connected to the gates of the transistors 130, 136, and 101.

A gate of the transistor 133 is connected to the wiring 115. The other of the source and the drain of the transistor 133 is connected to the gates of the transistors 130, 136, and 101. A gate of the transistor 132 is connected to the wiring 117. One of a source and a drain of the transistor 132 is connected to the wiring 111. The other of the source and the drain of the transistor 132 is connected to the gates of the transistors 130, 136, and 101. A gate of the transistor 137 is connected to the wiring 110. The one of the source and the drain of the transistor 137 is connected to the other of the source and the drain of the transistor 131 and the other of the source and the drain of transistor 130. The other of the source and the drain of the transistor 137 is connected to a gate of the transistor 138. One of a source and a drain of the transistor 138 is connected to the wiring 113. The other of the source and the drain of the transistor 138 is connected to the wiring 119.

A gate of the transistor 139 is connected to the wiring 110. The one of a source and a drain of the transistor 139 is connected to the other of the source and the drain of the transistor 131 and the other of the source and the drain of the transistor 130. The other of the source and the drain of the transistor 139 is connected to a gate of the transistor 102. One of a source and a drain of the transistor 102 is connected to the wiring 116. The other of the source and the drain of the transistor 102 is connected to the wiring 120.

Operation of the sequential circuit 10 illustrated in FIG. 2 is described with reference to a timing diagram in FIG. 3.

Figure 3:
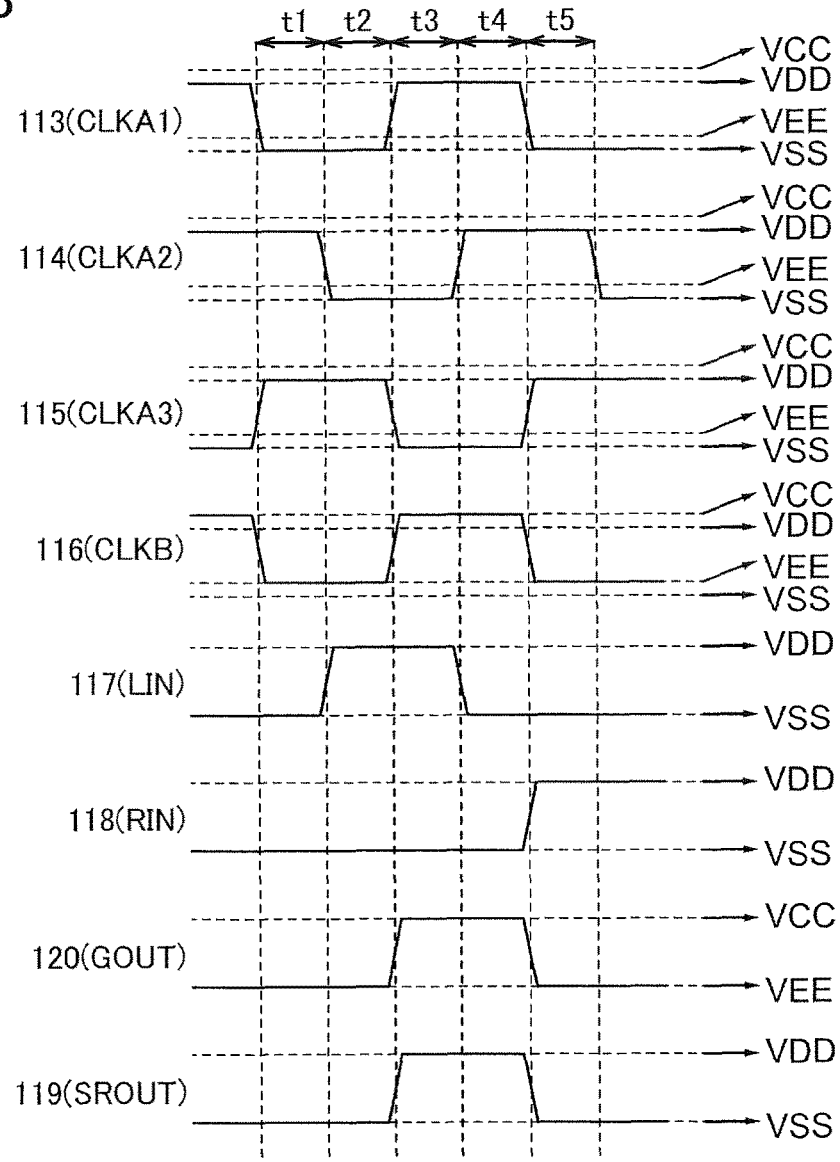
FIG. 3 is a timing diagram showing operation of a sequential circuit.

As shown in FIG. 3, in Time t1, the potential of the clock signal CLKA1 supplied to the wiring 113 is VSS, the potential of the clock signal CLKA2 supplied to the wiring 114 is VDD, the potential of the clock signal CLKA3 supplied to the wiring 115 is VDD, the potential of the clock signal CLKB supplied to the wiring 116 is VEE, the potential of the input signal LIN supplied to the wiring 117 is VSS, and the potential of the input signal RIN supplied to the wiring 118 is VSS.

Thus, in Time t1, the transistors 101, 130, 133, 134, 136, 137, and 139 are on, and the transistors 131, 132, 135, 138, and 102 are off in the sequential circuit 10. Accordingly, the power supply potential VEE of the wiring 112 is output from the wiring 120 as a potential of the output signal GOUT. In addition, the power supply potential VSS of the wiring 111 is output from the wiring 119 as a potential of the output signal SROUT.

As shown in FIG. 3, in Time t2, the potential of the clock signal CLKA1 supplied to the wiring 113 is VSS, the potential of the clock signal CLKA2 supplied to the wiring 114 is VSS, the potential of the clock signal CLKA3 supplied to the wiring 115 is VDD, the potential of the clock signal CLKB supplied to the wiring 116 is VEE, the potential of the input signal LIN supplied to the wiring 117 is VDD, and the potential of the input signal RIM supplied to the wiring 118 is VSS.

Thus, in Time t2, the transistors 131, 132, 133, 137, 138, 139, and 102 are on, and the transistors 101, 130, 134, 135, and 136 are off in the sequential circuit 10. Accordingly, the potential VEE of the clock signal CLKB of the wiring 116 is output from the wiring 120 as a potential of the output signal GOUT. In addition, the potential VSS of the clock signal CLKA1 of the wiring 113 is output from the wiring 119 as a potential of the output signal SROUT.

As shown in FIG. 3, in Time t3, the potential of the clock signal CLKA1 supplied to the wiring 113 is VDD, the potential of the clock signal CLKA2 supplied to the wiring 114 is VSS, the potential of the clock signal CLKA3 supplied to the wiring 115 is VSS, the potential of the clock signal CLKB supplied to the wiring 116 is VCC, the potential of the input signal LIN supplied to the wiring 117 is VDD, and the potential of the input signal RIN supplied to the wiring 118 is VSS.

Thus, in Time t3, the transistors 131, 132, 138, and 102 are on, and the transistors 101, 130, 133 to 137, and 139 are off in the sequential circuit 10. Accordingly, the potential VCC of the clock signal CLKB of the wiring 116 is output from the wiring 120 as a potential of the output signal GOUT. In addition, the potential VDD of the clock signal CLKA1 of the wiring 113 is output from the wiring 119 as a potential of the output signal SROUT.

As shown in FIG. 3, in Time t4, the potential of the clock signal CLKA1 supplied to the wiring 113 is VDD, the potential of the clock signal CLKA2 supplied to the wiring 114 is VDD, the potential of the clock signal CLKA3 supplied to the wiring 115 is VSS, the potential of the clock signal CLKB supplied to the wiring 116 is VCC, the potential of the input signal LIN supplied to the wiring 117 is VSS, and the potential of the input signal RIN supplied to the wiring 118 is VSS.

Thus, in Time t4, the transistors 134, 138, and 102 are on, and the transistors 101, 130, 131, 132, 133, 135, 136, 137, and 139 are off in the sequential circuit 10. Accordingly, the potential VCC of the clock signal CLKB of the wiring 116 is output from the wiring 120 as a potential of the output signal GOUT. In addition, the potential VDD of the clock signal CLKA1 of the wiring 113 is output from the wiring 119 as a potential of the output signal SROUT.

As shown in FIG. 3, in Time t5, the potential of the clock signal CLKA1 supplied to the wiring 113 is VSS, the potential of the clock signal CLKA2 supplied to the wiring 114 is VDD, the potential of the clock signal CLKA3 supplied to the wiring 115 is VDD, the potential of the clock signal CLKB supplied to the wiring 116 is VEE, the potential of the input signal LIN supplied to the wiring 117 is VSS, and the potential of the input signal RIN supplied to the wiring 118 is VDD.

Thus, in Time t5, the transistors 101, 130, 133, 134, 135, 136, 137, and 139 are on, and the transistors 131, 132, 138, and 102 are off in the sequential circuit 10. Accordingly, the power supply potential VEE of the wiring 112 is output from the wiring 120 as a potential of the output signal GOUT. In addition, the power supply potential VSS of the wiring 111 is output from the wiring 119 as a potential of the output signal SROUT.

Note that in the above operation, the transistor 101 is off in Times t2 to t4. In particular, in Times t3 and t4, since the potential of the clock signal CLKB that is supplied to the wiring 116 is the high-level potential VCC, current flows between the wirings 116 and 112 through the transistors 101 and 102 when the transistor 101 is on. However, in one embodiment of the present invention, the gate and the one of the source and the drain of the transistor 101 are electrically isolated from each other. Specifically, when the transistor 101 is off, the power supply potential VSS of the wiring 111 can be supplied to the gate of the transistor 101, and the power supply potential VEE of the wiring 112 can be supplied to the one of the source and the drain of the transistor 101. Thus, even when current flows between the wirings 116 and 112, the current increases the power supply potential VEE of the wiring 112, and the gate voltage Vgs of the transistor 101 becomes close to the threshold voltage Vth. Consequently, the transistor 101 can be eventually turned off.

In the above operation, the transistor 102 is off in Times t1 and t5. In Times t1 and t5, the power supply potential VSS of the wiring 111 is supplied to the gate of the transistor 102. However, since the potential VEE of the clock signal CLKB that is higher than the power supply potential VSS is supplied to the one of the source and the drain of the transistor 102, the gate voltage of the transistor 102 can be lower than the threshold voltage Vth. Specifically, the potential VEE is preferably higher than a potential that is obtained by subtracting the threshold voltage Vth from the potential VSS.

Figure 4:
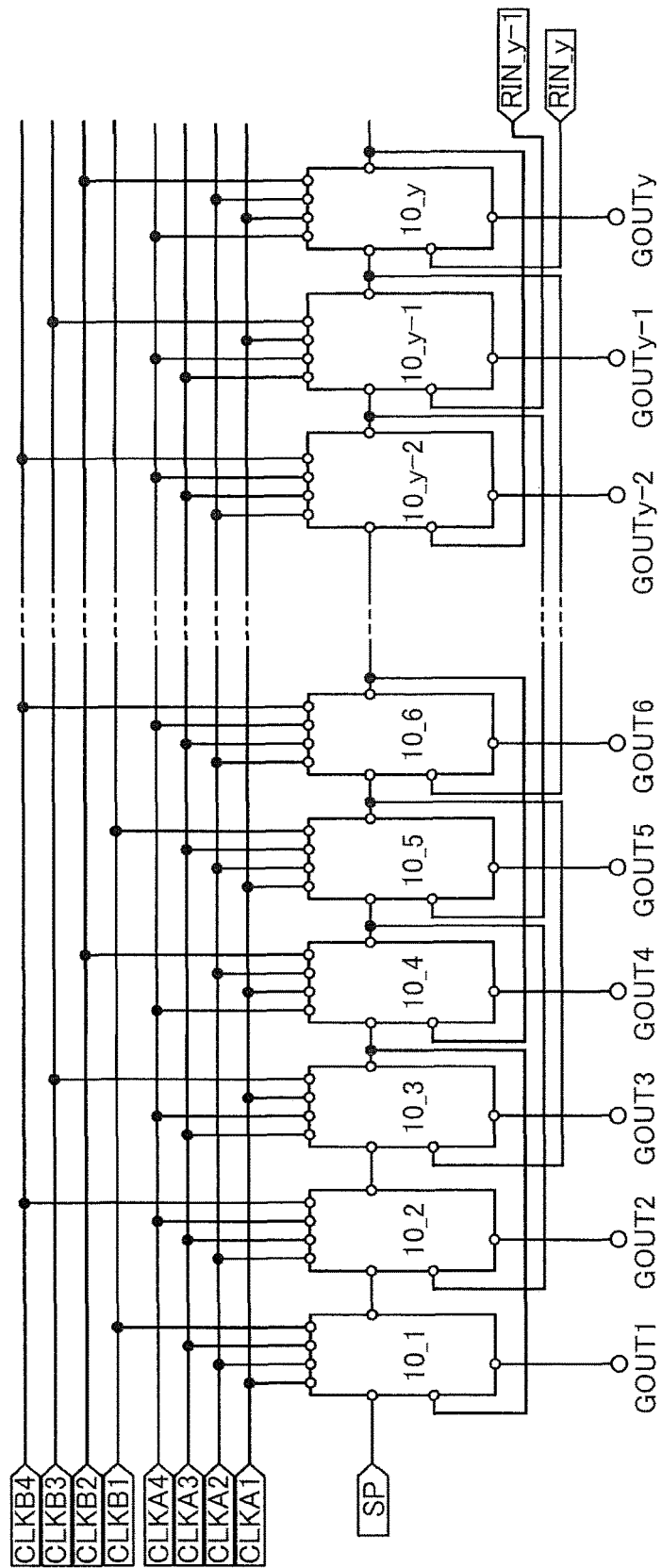
FIG. 4 illustrates a configuration of a shift register.

FIG. 4 illustrates an example of a shift register constituted by connecting the sequential circuits 10 in the plurality of stages to each other.

The shift register illustrated in FIG. 4 includes sequential circuits 10_1 to 10_y (y is a natural number). Each of the sequential circuits 10_1 to 10_y has the same structure as the sequential circuit 10 illustrated in FIG. 2. Any three of clock signals CLKA1 to CLKA4 are supplied to the wirings 113, 114, and 115 in FIG. 2 as the clock signals CLKA1, CLKA1, and CLKA3, respectively. One of clock signals CLKB1 to CLKB4 is supplied to the wiring 116 as the clock signal CLKB.

Specifically, in the sequential circuit 104m+1, the clock signals CLKA1, CLKA2, and CLKA3 are supplied to the wirings 113, 114, and 115, respectively. In the sequential circuit 10_4m+2, the clock signals CLKA2, CLKA3, and CLKA4 are supplied to the wirings 113, 114, and 115, respectively. In the sequential circuit 10_4m+3, the clock signals CLKA3, CLKA4, and CLKA1 are supplied to the wirings 113, 114, and 115, respectively. In the sequential circuit 104m+4, the clock signals CLKA4, CLKA1, and CLKA2 are supplied to the wirings 113, 114, and 115, respectively. Note that m is a given integer that meets the condition that the total number of the sequential circuits 10 is y.

Specifically, in the sequential circuit 10_4m+1, the clock signal CLKB1 is supplied to the wiring 116. In the sequential circuit 10_4m+2, the clock signal CLKB4 is supplied to the wiring 116. In the sequential circuit 10_4m+3, the clock signal CLKB3 is supplied to the wiring 116. In the sequential circuit 10_4m+4, the clock signal CLKB2 is supplied to the wiring 116.

Figure 6:
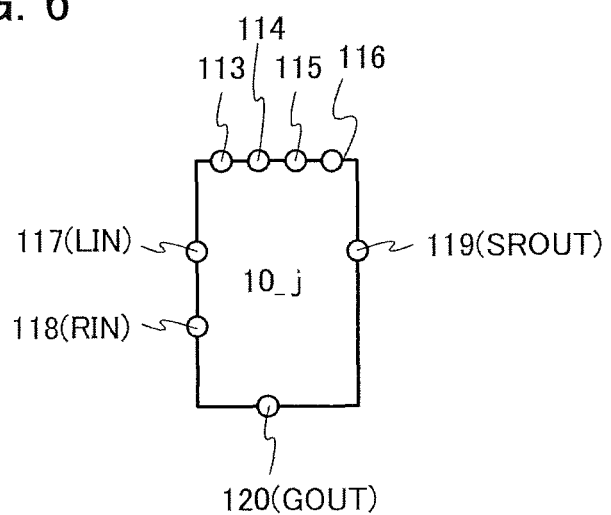
FIG. 6 schematically illustrates a j-th sequential circuit 10_j.

FIG. 6 schematically illustrates the positions of the wirings 113 to 120 in the sequential circuit 10_j (j is a natural number equal to or smaller than y) in the shift register in FIG. 4. As seen from FIG. 4 and FIG. 6, the output signal SROUTj−1 that is output from the wiring 119 in the sequential circuit 10_j−1 in the previous stage is supplied to the wiring 117 of the sequential circuit 10_j as the input signal LIN. Note that a potential of a start pulse signal SP is supplied to the wiring 117 in the sequential circuit 10_1 in the first stage.

The output signal SROUTj+2 that is output from the wiring 19 in the sequential circuit 10_j+2 in the stage following the next stage is supplied to the wiring 118 in the sequential circuit 10_j as the input signal RIN. Note that the input signal RIN_y−1 is supplied to the wiring 118 in the sequential circuit 10_y−1 in the (y−1)-th stage, and the input signal RIN_y is supplied to the wiring 118 in the sequential circuit 10_y in the y-th stage. The input signal RIN_y−1 is the output signal SROUTy+1 that may be output from the sequential circuit 10_y+1 assuming that the sequential circuit 10_y+1 is present. Further, the input signal RIN_y is the output signal SROUTy+2 that may be output from the sequential circuit 10_y+2 assuming that the sequential circuit 10_y+2 is present.

The output signal GOUT j is output from the wiring 120 in the sequential circuit 10_j.

Figure 5:
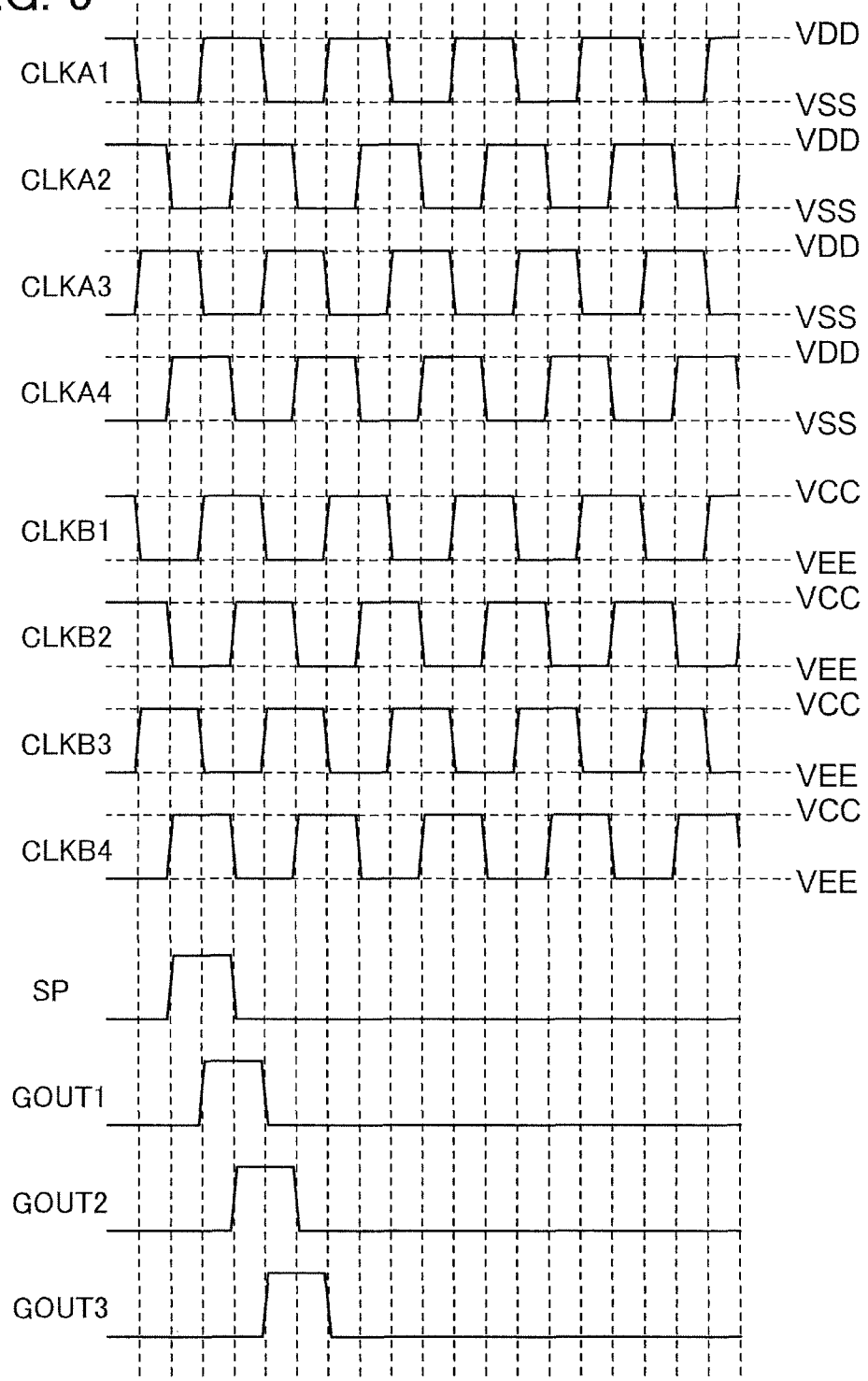
FIG. 5 is a timing diagram of operation of a shift register.

FIG. 5 is a timing diagram of the potentials of the clock signals CLK1 to CLK4, the potential of the start pulse signal SP, and the potentials of the output signals GOUT 1 to GOUT 3. The clock signals CLK1 to CLK4 have waveforms whose potential rise timings are shifted backward by ¼ period. The shift register illustrated in FIG. 4 operates in response to the signals. The shift register illustrated in FIG. 4 outputs the output signals GOUT 1 to GOUT y having pulse widths which correspond to ½ period of the clock signals and waveforms whose pulses are shifted backward by ¼ period of the clock signals.

For example, in the case where the output signals GOUT 1 to GOUT y are supplied to a wiring called a bus line that is connected to a plurality of pixels in a semiconductor display device by the shift register illustrated in FIG. 4, the output-side transistors 101 and 102 in each of the sequential circuits 10_1 to 10_y need to have a large current supply capability. Thus, the channel width W of each of the transistors 101 and 102 is made larger than that of a transistor other than the transistors 101 and 102 in many cases. Consequently, when the transistors 101 and 102 are normally on, an increase in power consumption of the shift register or a decrease in amplitude of the output signals GOUT 1 to GOUT y remarkably occurs. However, in one embodiment of the present invention, even when the output-side transistors 101 and 102 in each of the sequential circuits 10_1 to 10_y are normally on, the transistors 101 and 102 can be turned off when they should be turned off.

Thus, the semiconductor device of one embodiment of the present invention that includes the above shift register consumes less power and can prevent a decrease in amplitude of the output signals GOUT 1 to GOUT y. A semiconductor display device of one embodiment of the present invention that includes the above shift register consumes less power and can prevent a display defect due to small amplitude of a signal supplied to the bus line.

<Specific Configuration Example 2 of Sequential Circuit>

Another configuration examples of the sequential circuit of one embodiment of the present invention are described.

Figure 7A:
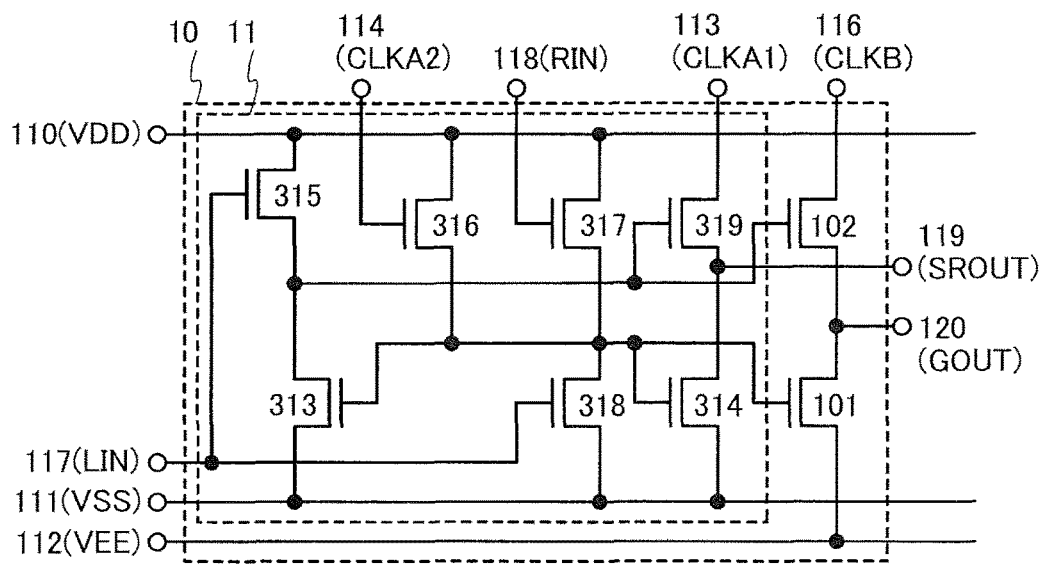
FIGS. 7A and 7B each illustrate a configuration of a sequential circuit.

The sequential circuit 10 illustrated in FIG. 7A includes the circuit 11, the transistor 101, and the transistor 102. The transistors 101 and 102 correspond to the transistors 12 and 13, respectively, in FIG. 1A. In the sequential circuit 10, a variety of power supply potentials are supplied through the wirings 110, 111, and 112, and the clock signals CLKA1 and CLKA2 are supplied through the wirings 113 and 114, respectively. The clock signal CLKB is supplied through the wiring 116, the input signal LIN is supplied through the wiring 117, and the input signal RIN is supplied through the wiring 118. In the sequential circuit 10, the output signal SROUT is output through the wiring 119, and the output signal GOUT is output through the wiring 120.

In the sequential circuit 10 illustrated in FIG. 7A, the circuit 11 includes transistors 313 to 319.

A shift register can be constituted by connecting the sequential circuits 10 in the plurality of stages to each other.

A gate of the transistor 313 is connected to gates of the transistors 314 and 101. One of a source and a drain of the transistor 313 is connected to the wiring 111. The other of the source and the drain of the transistor 313 is connected to gates of the transistors 319 and 102. One of a source and a drain of the transistor 314 is connected to the wiring 111, and the other of the source and the drain of the transistor 314 is connected to the wiring 119. One of a source and a drain of the transistor 101 is connected to the wiring 112, and the other of the source and the drain of the transistor 101 is connected to the wiring 120.

A gate of the transistor 315 is connected to the wiring 117. One of a source and a drain of the transistor 315 is connected to the wiring 110. The other of the source and the drain of the transistor 315 is connected to the gates of the transistors 319 and 102. A gate of the transistor 316 is connected to the wiring 114. One of a source and a drain of the transistor 316 is connected to the wiring 110. The other of the source and the drain of the transistor 316 is connected to the gates of the transistors 313, 314, and 101. A gate of the transistor 317 is connected to the wiring 118. One of a source and a drain of the transistor 317 is connected to the wiring 110. The other of the source and the drain of the transistor 317 is connected to the gates of the transistors 313, 314, and 101.

A gate of the transistor 318 is connected to the wiring 117. One of a source and a drain of the transistor 318 is connected to the wiring 111. The other of the source and the drain of the transistor 318 is connected to gates of the transistors 313, 314, and 101. The gate of the transistor 319 is connected to the gate of the transistor 102. One of a source and a drain of the transistor 319 is connected to the wiring 113. The other of the source and the drain of the transistor 319 is connected to the wiring 119. The gate of the transistor 102 is connected to the gate of the transistor 319. One of a source and a drain of the transistor 102 is connected to the wiring 116. The other of the source and the drain of the transistor 102 is connected to the wiring 120.

FIG. 7A illustrates an example of the sequential circuit 10 in which all of the transistors are n-channel transistors. Specifically, FIG. 7A illustrates a case where the power supply potential VDD is supplied to the wiring 110, the power supply potential VSS is supplied to the wiring 111, and the power supply potential VEE is supplied to the wiring 112 as an example.

In the sequential circuit 10 in FIG. 7A, the gate and the one of the source and the drain of the output-side transistor 101 can be electrically isolated from each other. Thus, even when the transistor 101 is normally on and thus the potential of the wiring 112 for supplying a potential to the one of the source and the drain of the transistor 101 is raised, the transistor 101 can be turned off when it should be turned off. Since the potential VEE of the clock signal CLKB that is higher than the power supply potential VSS is supplied to the one of the source and the drain of the transistor 102, the gate voltage of the transistor 102 can be lower than the threshold voltage Vth. Thus, even when the transistor 102 is normally on, the transistor 102 can be turned off when it should be turned off.

Figure 7B:
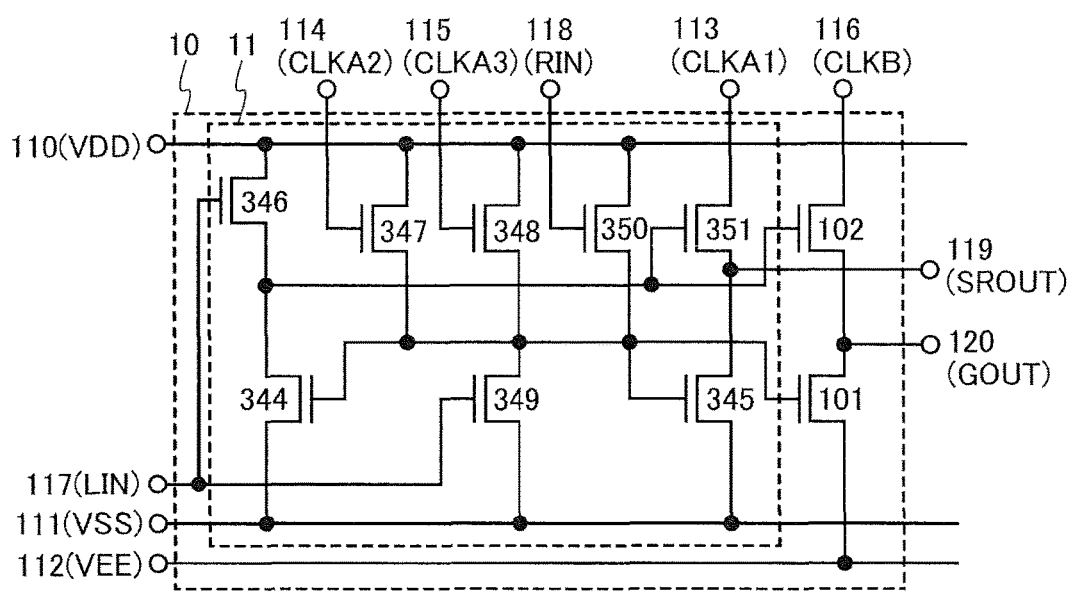

The sequential circuit 10 in FIG. 7B includes the circuit 11, the transistor 101, and the transistor 102. The transistors 101 and 102 correspond to the transistors 12 and 13, respectively, in FIG. 1A. In the sequential circuit 10, a variety of power supply potentials are supplied through the wirings 110, 111, and 112, and the clock signals CLKA1, CLKA2, and CLKA3 are supplied through wirings 113, 114, and 115, respectively. The clock signal CLKB is supplied through the wiring 116, the input signal LIN is supplied through the wiring 117, and the input signal RIN is supplied through the wiring 118. In the sequential circuit 10, the output signal SROUT is output through the wiring 119, and the output signal GOUT is output through the wiring 120.

In the sequential circuit 10 in FIG. 7B, the circuit 11 includes transistors 344 to 351.

A shift register can be constituted by connecting the sequential circuits 10 in the plurality of stages to each other.

A gate of the transistor 344 is connected to gates of the transistors 345 and 101. One of a source and a drain of the transistor 344 is connected to the wiring 111. The other of the source and the drain of the transistor 344 is connected gates of the transistors 351 and 102. One of a source and a drain of the transistor 345 is connected to the wiring 111, and the other of the source and the drain of the transistor 345 is connected to the wiring 119. One of a source and a drain of the transistor 101 is connected to the wiring 112, and the other of the source and the drain of the transistor 101 is connected to the wiring 120.

A gate of the transistor 346 is connected to the wiring 117. One of a source and a drain of the transistor 346 is connected to the wiring 110. The other of the source and the drain of the transistor 346 is connected to the gates of the transistors 351 and 102. A gate of the transistor 347 is connected to the wiring 114. One of a source and a drain of the transistor 347 is connected to the wiring 110. The other of the source and the drain of the transistor 347 is connected to the gates of the transistors 344, 345, and 101. A gate of the transistor 348 is connected to the wiring 115. One of a source and a drain of the transistor 348 is connected to the wiring 110. The other of the source and the drain of the transistor 348 is connected to the gates of the transistors 344, 345, and 101. A gate of the transistor 349 is connected to the wiring 117. One of a source and a drain of the transistor 349 is connected to the wiring 111. The other of the source and the drain of the transistor 349 is connected to the gates of the transistors 344, 345, and 101.

A gate of the transistor 350 is connected to the wiring 118. One of a source and a drain of the transistor 350 is connected to the wiring 110. The other of the source and the drain of the transistor 350 is connected to gates of the transistors 344, 345, and 101. The gate of the transistor 351 is connected to the gate of the transistor 102. One of a source and a drain of the transistor 351 is connected to the wiring 113. The other of the source and the drain of the transistor 351 is connected to the wiring 119. The gate of the transistor 102 is connected to the gate of the transistor 351. One of a source and a drain of the transistor 102 is connected to the wiring 116, and the other of the source and the drain of the transistor 102 is connected to the wiring 120.

FIG. 7B illustrates an example of the sequential circuit 10 in which all of the transistors are n-channel transistors. Specifically, FIG. 7B illustrates a case where the power supply potential VDD is supplied to the wiring 110, the power supply potential VSS is supplied to the wiring 111, and the power supply potential VEE is supplied to the wiring 112 as an example.

In the sequential circuit 10 in FIG. 7B, the gate and the one of the source and the drain of the output-side transistor 101 can be electrically isolated from each other. Thus, even when the transistor 101 is normally on and thus the potential of the wiring 112 for supplying a potential to the one of the source and the drain of the transistor 101 is raised, the transistor 101 can be turned off when it should be turned off Since the potential VEE of the clock signal CLKB that is higher than the power supply potential VSS is supplied to the one of the source and the drain of the transistor 102, the gate voltage of the transistor 102 can be lower than the threshold voltage Vth. Thus, even when the transistor 102 is normally on, the transistor 102 can be turned off when it should be turned off.

Figure 8A:
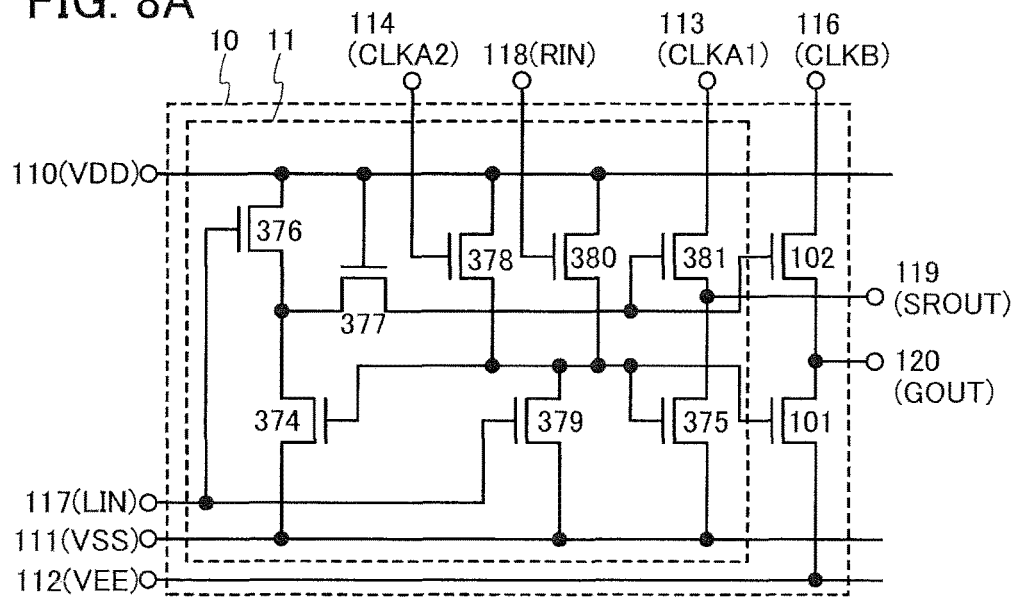
FIGS. 8A and 8B each illustrate a configuration of a sequential circuit.

The sequential circuit 10 in FIG. 8A includes the circuit 11, the transistor 101, and the transistor 102. The transistors 101 and 102 correspond to the transistors 12 and 13, respectively, in FIG. 1A. In the sequential circuit 10, a variety of power supply potentials are supplied through the wirings 110, 111, and 112, and the clock signals CLKA1 and CLKA2 are supplied through the wirings 113 and 114, respectively. The clock signal CLKB is supplied through the wiring 116, the input signal LIN is supplied through the wiring 117, and the input signal RN is supplied through the wiring 118. In the sequential circuit 10, the output signal SROUT is output through the wiring 119, and the output signal GOUT is output through the wiring 120.

In the sequential circuit 10 in FIG. 8A, the circuit 11 includes transistors 374 to 381.

A shift register can be constituted by connecting the sequential circuits 10 in the plurality of stages to each other.

A gate of the transistor 374 is connected to gates of the transistors 375 and 101. One of a source and a drain of the transistor 374 is connected to the wiring 111. The other of the source and the drain of the transistor 374 is connected to one of a source and a drain of the transistor 377. One of a source and a drain of the transistor 375 is connected to the wiring 111, and the other of the source and the drain of the transistor 375 is connected to the wiring 119. One of a source and a drain of the transistor 101 is connected to the wiring 112, and the other of the source and the drain of the transistor 101 is connected to the wiring 120.

A gate of the transistor 376 is connected to the wiring 117. One of a source and a drain of the transistor 376 is connected to the wiring 110. The other of the source and the drain of the transistor 376 is connected to the one of the source and the drain of the transistor 377. A gate of the transistor 377 is connected to the wiring 110. The other of the source and the drain of the transistor 377 is connected to gates of the transistors 381 and 102. A gate of the transistor 378 is connected to the wiring 114. One of a source and a drain of the transistor 378 is connected to the wiring 110. The other of the source and the drain of the transistor 378 is connected to the gates of the transistors 374, 375, and 101.

A gate of the transistor 379 is connected to the wiring 117. One of a source and a drain of the transistor 379 is connected to the wiring 111. The other of the source and the drain of the transistor 379 is connected to the gates of the transistors 374, 375, and 101. A gate of the transistor 380 is connected to the wiring 118. One of a source and a drain of the transistor 380 is connected to the wiring 110. The other of the source and the drain of the transistor 380 is connected to the gates of the transistors 374, 375, and 101. One of a source and a drain of the transistor 381 is connected to the wiring 113. The other of the source and the drain of the transistor 381 is connected to the wiring 119. One of a source and a drain of the transistor 102 is connected to the wiring 116. The other of the source and the drain of the transistor 102 is connected to the wiring 120.

FIG. 8A illustrates an example of the sequential circuit 10 in which all of the transistors are n-channel transistors. Specifically, FIG. 8A illustrates a case where the power supply potential VDD is supplied to the wiring 110, the power supply potential VSS is supplied to the wiring 111, and the power supply potential VEE is supplied to the wiring 112 as an example.

In the sequential circuit 10 in FIG. 8A, the gate and the one of the source and the drain of the output-side transistor 101 can be electrically isolated from each other. Thus, even when the transistor 101 is normally on and thus the potential of the wiring 112 for supplying a potential to the one of the source and the drain of the transistor 101 is raised, the transistor 101 can be turned off when it should be turned off. Since the potential VEE of the clock signal CLKB that is higher than the power supply potential VSS is supplied to the one of the source and the drain of the transistor 102, the gate voltage of the transistor 102 can be lower than the threshold voltage Vth. Thus, even when the transistor 102 is normally on, the transistor 102 can be turned off when it should be turned off.

Figure 8B:
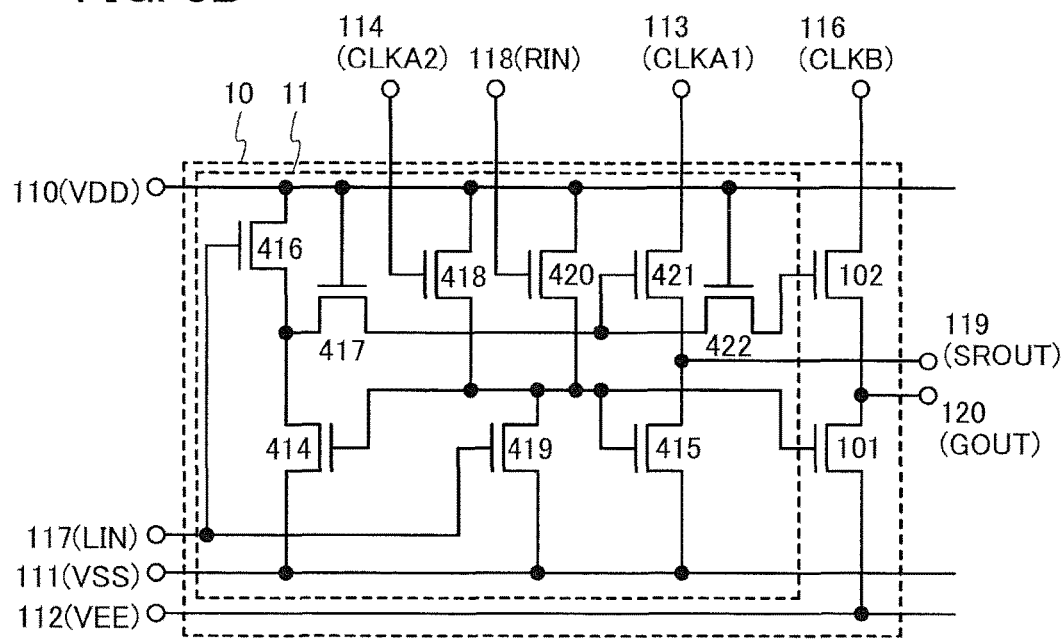

The sequential circuit 10 in FIG. 8B includes the circuit 11, the transistor 101, and the transistor 102. The transistors 101 and 102 correspond to the transistors 12 and 13, respectively, in FIG. 1A. In the sequential circuit 10, a variety of power supply potentials are supplied through the wirings 110, 111, and 112, and the clock signals CLKA1 and CLKA2 are supplied through the wirings 113 and 114, respectively. The clock signal CLKB is supplied through the wiring 116, the input signal LIN is supplied through the wiring 117, and the input signal RIN is supplied through the wiring 118. In the sequential circuit 10, the output signal SROUT is output through the wiring 119, and the output signal GOUT is output through the wiring 120.

In the sequential circuit 10 in FIG. 8B, the circuit 11 includes transistors 414 to 422.

A shift register can be constituted by connecting the sequential circuits 10 in the plurality of stages to each other.

A gate of the transistor 414 is connected to gates of the transistors 415 and 101. One of a source and a drain of the transistor 414 is connected to the wiring 111. The other of the source and the drain of the transistor 414 is connected to one of a source and a drain of the transistor 417. One of a source and a drain of the transistor 415 is connected to the wiring 111, and the other of the source and the drain of the transistor 415 is connected to the wiring 119. One of a source and a drain of the transistor 101 is connected to the wiring 112, and the other of the source and the drain of the transistor 101 is connected to the wiring 120.

A gate of the transistor 416 is connected to the wiring 117. One of a source and a drain of the transistor 416 is connected to the wiring 110. The other of the source and the drain of the transistor 416 is connected to the one of the source and the drain of the transistor 417. A gate of the transistor 417 is connected to the wiring 110. The other of the source and the drain of the transistor 417 is connected to a gate of the transistor 421. A gate of the transistor 418 is connected to the wiring 114. One of a source and a drain of the transistor 418 is connected to the wiring 110. The other of the source and the drain of the transistor 418 is connected to the gates of the transistors 414, 415, and 101. A gate of the transistor 419 is connected to the wiring 117. One of a source and a drain of the transistor 419 is connected to the wiring 111. The other of the source and the drain of the transistor 419 is connected to the gates of the transistors 414, 415, and 101. A gate of the transistor 420 is connected to the wiring 118. One of a source and a drain of the transistor 420 is connected to the wiring 110. The other of the source and the drain of the transistor 420 is connected to the gates of the transistors 414, 415, and 101. One of a source and a drain of the transistor 421 is connected to the wiring 113. The other of the source and the drain of the transistor 421 is connected to the wiring 119. A gate of the transistor 422 is connected to the wiring 110. One of a source and a drain of the transistor 422 is connected to the gate of the transistor 421 and the other of the source and the drain of the transistor 417. The other of the source and the drain of the transistor 422 is connected to a gate of the transistor 102. One of a source and a drain of the transistor 102 is connected to the wiring 116. The other of the source and the drain of the transistor 102 is connected to the wiring 120.

FIG. 8B illustrates an example of the sequential circuit 10 in which all of the transistors are n-channel transistors. Specifically, FIG. 8B illustrates a case where the power supply potential VDD is supplied to the wiring 110, the power supply potential VSS is supplied to the wiring 111, and the power supply potential VEE is supplied to the wiring 112 as an example.

In the sequential circuit 10 in FIG. 8B, the gate and the one of the source and the drain of the output-side transistor 101 can be electrically isolated from each other. Thus, even when the transistor 101 is normally on and thus the potential of the wiring 112 for supplying a potential to the one of the source and the drain of the transistor 101 is raised, the transistor 101 can be turned off when it should be turned off. Since the potential VEE of the clock signal CLKB that is higher than the power supply potential VSS is supplied to the one of the source and the drain of the transistor 102, the gate voltage of the transistor 102 can be lower than the threshold voltage Vth. Thus, even when the transistor 102 is normally on, the transistor 102 can be turned off when it should be turned off.

Figure 9:
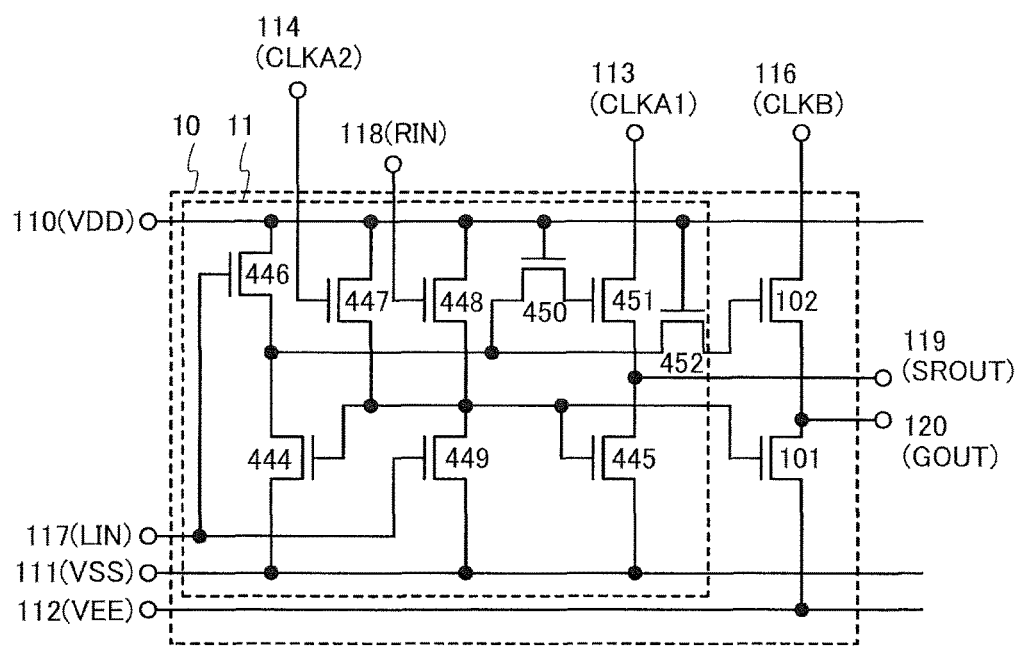
FIG. 9 illustrates a configuration of a sequential circuit.

The sequential circuit 10 in FIG. 9 includes the circuit 11, the transistor 101, and the transistor 102. The transistors 101 and 102 correspond to the transistors 12 and 13, respectively, in FIG. 1A. In the sequential circuit 10, a variety of power supply potentials are supplied through the wirings 110, 111, and 112, and the clock signals CLKA1 and CLKA2 are supplied through the wirings 113 and 114, respectively. The clock signal CLKB is supplied through the wiring 116, the input signal LIN is supplied through the wiring 117, and the input signal RIN is supplied through the wiring 118. In the sequential circuit 10, the output signal SROUT is output through the wiring 119, and the output signal GOUT is output through the wiring 120.

In the sequential circuit 10 in FIG. 9, the circuit 11 includes transistors 444 to 452.

A shift register can be constituted by connecting the sequential circuits 10 in the plurality of stages to each other.

A gate of the transistor 444 is connected to gates of the transistors 445 and 101. One of a source and a drain of the transistor 444 is connected to the wiring 111. The other of the source and the drain of the transistor 444 is connected to one of a source and a drain of the transistor 452. One of a source and a drain of the transistor 445 is connected to the wiring 111, and the other of the source and the drain of the transistor 445 is connected to the wiring 119. One of a source and a drain of the transistor 101 is connected to the wiring 112, and the other of the source and the drain of the transistor 101 is connected to the wiring 120.

A gate of the transistor 446 is connected to the wiring 117. One of a source and a drain of the transistor 446 is connected to the wiring 110. The other of the source and the drain of the transistor 446 is connected to the one of the source and the drain of the transistor 452. A gate of the transistor 447 is connected to the wiring 114. One of a source and a drain of the transistor 447 is connected to the wiring 110. The other of the source and the drain of the transistor 447 is connected to the gates of the transistors 444, 445, and 101. A gate of the transistor 448 is connected to the wiring 118. One of a source and a drain of the transistor 448 is connected to the wiring 110. The other of the source and the drain of the transistor 448 is connected to the gates of the transistors

444, 445, and 101. A gate of the transistor 449 is connected to the wiring 117. One of a source and a drain of the transistor 449 is connected to the wiring 111. The other of the source and the drain of the transistor 449 is connected to the gates of the transistors 444, 445, and 101. A gate of the transistor 450 is connected to the wiring 110. One of a source and a drain of the transistor 450 is connected to the one of the source and the drain of the transistor 452. The other of the source and the drain of the transistor 450 is connected to the gate of the transistor 451. One of a source and a drain of the transistor 451 is connected to the wiring 113. The other of the source and the drain of the transistor 451 is connected to the wiring 119. A gate of the transistor 452 is connected to the wiring 110. The other of the source and the drain of the transistor 452 is connected to a gate of the transistor 102. One of a source and a drain of the transistor 102 is connected to the wiring 116. The other of the source and the drain of the transistor 102 is connected to the wiring 120.

FIG. 9 illustrates an example of the sequential circuit 10 in which all of the transistors are n-channel transistors. Specifically, FIG. 9 illustrates a case where the power supply potential VDD is supplied to the wiring 110, the power supply potential VSS is supplied to the wiring 111, and the power supply potential VEE is supplied to the wiring 112 as an example.

In the sequential circuit 10 in FIG. 9, the gate and the one of the source and the drain of the output-side transistor 101 can be electrically isolated from each other. Thus, even when the transistor 101 is normally on and thus the potential of the wiring 112 for supplying a potential to the one of the source and the drain of the transistor 101 is raised, the transistor 101 can be turned off when it should be turned off. Since the potential VEE of the clock signal CLKB that is higher than the power supply potential VSS is supplied to the one of the source and the drain of the transistor 102, the gate voltage of the transistor 102 can be lower than the threshold voltage Vth. Thus, even when the transistor 102 is normally on, the transistor 102 can be turned off when it should be turned off.

<Structure Example of Semiconductor Display Device>

Next, a structure example of a semiconductor display device of one embodiment of the present invention is described.

Figure 10A:
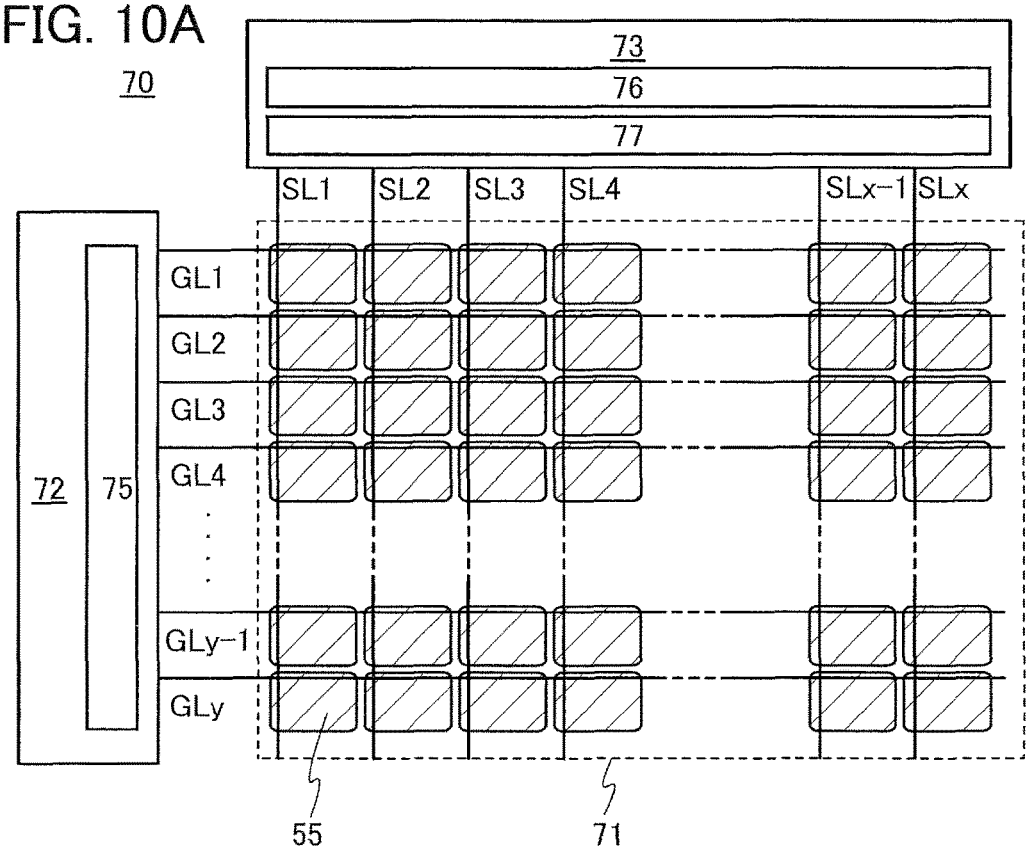
FIGS. 10A to 10C illustrate configurations of a semiconductor display device.

In a semiconductor display device 70 illustrated in FIG. 10A, a pixel portion 71 includes a plurality of pixels 55, wirings GL (wirings GL1 to GLy, y: a natural number) that correspond to bus lines each selecting the pixels 55 in a row, and wirings SL (wirings SL1 to SLx, x: a natural number) for supplying video signals to the selected pixels 55. The input of signals to the wirings GL is controlled by a driver circuit 72. The input of video signals to the wirings SL is controlled by a driver circuit 73. Each of the plurality of pixels 55 is connected to at least one of the wirings GL and at least one of the wirings SL.

Specifically, the driver circuit 72 includes a shift register 75 that produces signals for sequentially selecting wirings GL1 to GLy. Moreover, specifically, the driver circuit 73 includes a shift register 76 that sequentially produces signals having pulses and a switching circuit 77 that controls supply of video signals to wirings SL1 to SLx in accordance with the signals produced in the shift register 76.

The sequential circuit of one embodiment of the present invention can be used for one or both of the shift registers 75 and 76.

Note that the kinds and number of the wirings in the pixel portion 71 can be determined by the structure, number, and position of the pixels 55. Specifically, in the pixel portion 71 illustrated in FIG. 10A, the pixels 55 are arranged in a matrix of x columns and y rows, and the wirings SL1 to SLx and the wirings GL1 to GLy are provided in the pixel portion 71 as an example.

Although FIG. 10A illustrates the case where the driver circuits 72 and 73 and the pixel portion 71 are formed over one substrate as an example, the driver circuits 72 and 73 may be formed over a substrate different from a substrate over which the pixel portion 71 is formed.

Figure 10B:
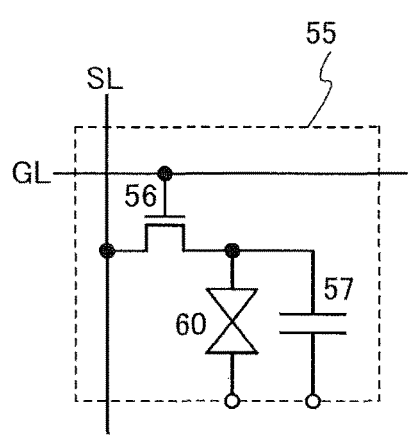

FIG. 10B illustrates an example of a configuration of the pixel 55. Each of the pixels 55 includes a liquid crystal element 60, a transistor 56 that controls the supply of an video signal to the liquid crystal element 60, and a capacitor 57 that holds voltage between a pixel electrode and a common electrode of the liquid crystal element 60. The liquid crystal element 60 includes the pixel electrode, the common electrode, and a liquid crystal layer containing a liquid crystal material to which voltage between the pixel electrode and the common electrode is applied.

The transistor 56 controls whether to supply the potential of the wiring SL to the pixel electrode of the liquid crystal element 60. A predetermined potential is supplied to the common electrode of the liquid crystal element 60.

The connection state between the transistor 56 and the liquid crystal element 60 is specifically described below. In FIG. 10B, a gate of the transistor 56 is connected to any one of the wirings GL1 to GLy. One of a source and a drain of the transistor 56 is connected to any one of the wirings SL1 to SLx, and the other is connected to the pixel electrode of the liquid crystal element 60.

The transmittance of the liquid crystal element 60 changes when the alignment of liquid crystal molecules included in the liquid crystal layer changes in accordance with the level of voltage applied between the pixel electrode and the common electrode. Accordingly, when the transmittance of the liquid crystal element 60 is controlled by the potential of an video signal supplied to the pixel electrode, gray-scale images can be displayed. In each of the plurality of pixels 55 included in the pixel portion 71, the gray level of the liquid crystal element 60 is adjusted in response to an video signal containing image data; thus, an image is displayed on the pixel portion 71.

FIG. 10B illustrates an example in which the one transistor 56 is used as a switch for controlling the input of an video signal to the pixel 55. However, a plurality of transistors functioning as one switch may be used in the pixel 55.

In one embodiment of the present invention, the transistor 56 with extremely low off-state current is preferably used as the switch for controlling the input of an video signal to the pixel 55. With the transistor 56 having extremely low off-state current, leakage of charge through the transistor 56 can be prevented. Thus, the potential of an video signal that is supplied to the liquid crystal element 60 and the capacitor 57 can be held more reliably. Accordingly, changes in transmittance of the liquid crystal element 60 due to leakage of charge in one frame period are prevented, so that the quality of an image to be displayed can be improved. Since leakage of charge through the transistor 56 can be prevented when the transistor 56 has low off-state current, the supply of a power supply potential or a signal to the driver circuits 72 and 73 may be stopped in a period during which a still image is displayed. With the above configuration, the number of times of writing video signals to the pixel portion 71 can be reduced, and thus power consumption of the semiconductor display device can be reduced.

For example, the off-state current of a transistor including a semiconductor film containing an oxide semiconductor can be extremely low, and therefore is suitable for the transistor 56, for example.

In addition, the transistor 56 in FIG. 10B may include a pair of gate electrodes overlapping with each other with a semiconductor film provided therebetween. The pair of gate electrodes are electrically connected to each other. In one embodiment of the present invention, the above structure allows the on-state current and the reliability of the transistor 56 to be increased.

Figure 10C:
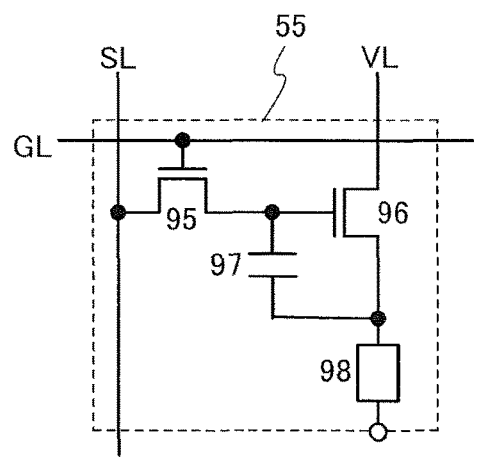

Next, FIG. 10C illustrates another example of the pixel 55. The pixel 55 includes a transistor 95 for controlling input of a video signal to the pixel 55, a light-emitting element 98, a transistor 96 for controlling the value of current supplied to the light-emitting element 98 in response to an video signal, and a capacitor 97 for holding the potential of an video signal.

Examples of the light-emitting element 98 include an element whose luminance is controlled by current or voltage, such as a light-emitting diode (LED) or an organic light-emitting diode (OLED). For example, an OLED includes at least an EL layer, an anode, and a cathode. The EL layer is formed using a single layer or a plurality of layers between the anode and the cathode, at least one of which is a light-emitting layer containing a light-emitting substance.

From the EL layer, electroluminescence is obtained by current supplied when a potential difference between the cathode and the anode is higher than or equal to the threshold voltage of the light-emitting element 98. As electroluminescence, there are luminescence (fluorescence) at the time of returning from a singlet-excited state to a ground state and luminescence (phosphorescence) at the time of returning from a triplet-excited state to a ground state.

The potential of one of the anode and the cathode of the light-emitting element 98 is controlled in response to an video signal input to the pixel 55. The one of the anode and the cathode whose potential is controlled in response to a video signal is used as a pixel electrode, and the other is used as a common electrode. A predetermined potential is supplied to the common electrode of the light-emitting element 98, and the luminance of the light-emitting element 98 is determined by a potential difference between the pixel electrode and the common electrode. Thus, the luminance of the light-emitting element 98 is controlled by the potential of the video signal, so that the light-emitting element 98 can express gray level. In each of the plurality of pixels 55 included in the pixel portion, the gray level of the light-emitting element 98 is adjusted in response to an video signal containing image data; thus, an image is displayed on the pixel portion 71.

Next, connection between the transistor 95, the transistor 96, the capacitor 97, and the light-emitting element 98 that are included in the pixel 55 is described.

One of a source and a drain of the transistor 95 is connected to the wiring SL, and the other is connected to a gate of the transistor 96. A gate of the transistor 95 is connected to the wiring GL. One of a source and a drain of the transistor 96 is connected to a power supply line VL, and the other is connected to the light-emitting element 98. Specifically, the other of the source and the drain of the transistor 96 is connected to one of the anode and the cathode of the light-emitting element 98. A predetermined potential is supplied to the other of the anode and the cathode of the light-emitting element 98.

FIG. 10C illustrates the case where the transistor 96 includes a pair of gate electrodes overlapping with each other with a semiconductor film provided therebetween. The pair of gate electrodes are electrically connected to each other. In one embodiment of the present invention, the above structure allows the on-state current and the reliability of the transistor 96 to be increased.

<Structure of Pixel>

Figure 11:
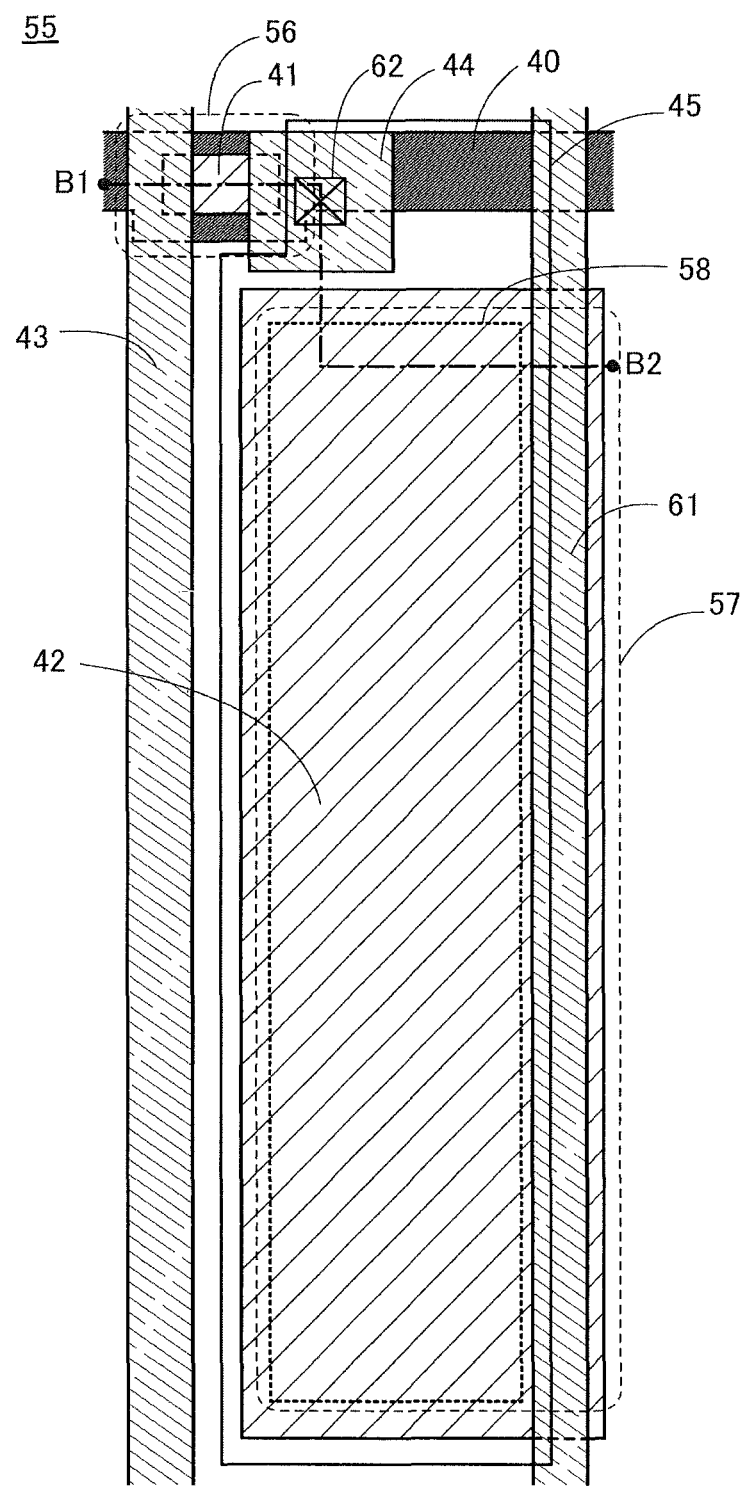
FIG. 11 is a top view of a pixel.
Figure 12:
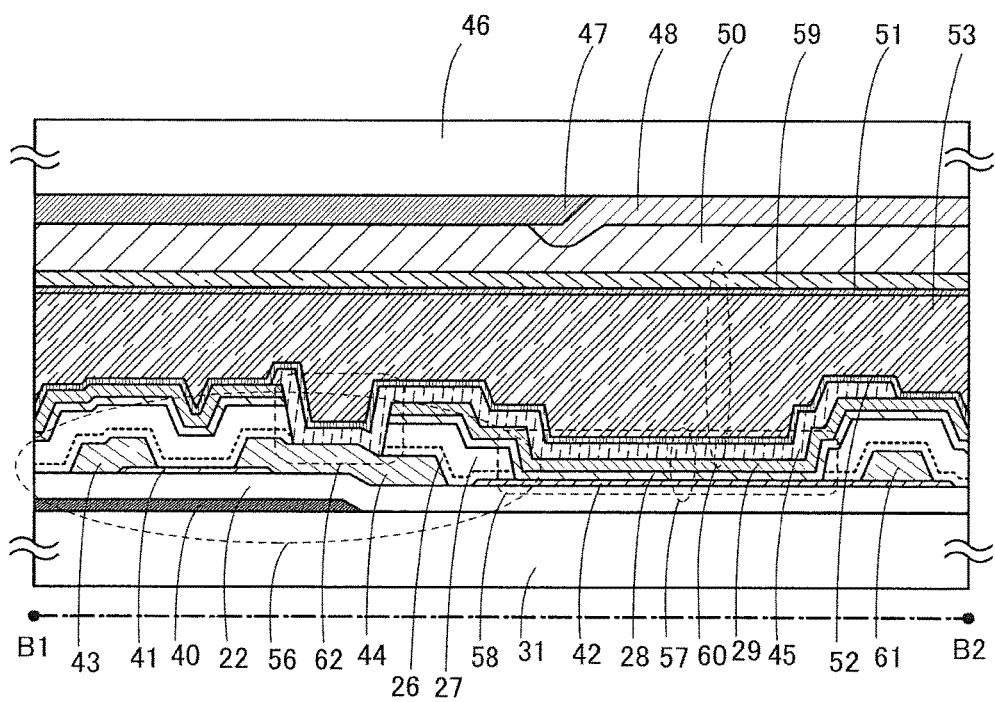
FIG. 12 is a cross-sectional view of the pixel.

Next, description is given of a structure example of the pixel 55 in a liquid crystal display device that is an example of the semiconductor display device 70 illustrated in FIG. 10A. FIG. 11 illustrates as an example of a top view of the pixel 55. Insulating films are not illustrated in FIG. 11 in order to clarify the layout of the pixel 55. FIG. 12 is a cross-sectional view of the liquid crystal display device using an element substrate including the pixel 55 illustrated in FIG. 11. In the liquid crystal display device in FIG. 12, the element substrate including a substrate 31 corresponds to a cross-sectional view along the dashed line B1-B2 in FIG. 11.

The pixel 55 illustrated in FIG. 11 and FIG. 12 includes the transistor 56 and the capacitor 57. In FIG. 12, the pixel 55 includes the liquid crystal element 60.

Over the substrate 31 having an insulating surface, the transistor 56 includes a conductive film 40 serving as a gate electrode, an insulating film 22 that is over the conductive film 40 and serves as a gate insulating film, an oxide semiconductor film 41 that is over the insulating film 22 and overlaps with the conductive film 40, and a conductive film 43 and a conductive film 44 that are electrically connected to the oxide semiconductor film 41 and serve as a source electrode and a drain electrode. The conductive film 40 serves as the wiring GL illustrated in FIG. 10B. The conductive film 43 serves as the wiring SL illustrated in FIG. 10B.

The pixel 55 includes a metal oxide film 42 over the insulating film 22. The metal oxide film 42 is a conductive film that transmits visible light. A conductive film 61 electrically connected to the metal oxide film 42 is provided over the metal oxide film 42. The conductive film 61 serves as a wiring that supplies a predetermined potential to the metal oxide film 42.

The insulating film 22 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, oxynitride contains more oxygen than nitrogen, and nitride oxide contains more nitrogen than oxygen.

In FIG. 12, an insulating film 26 and an insulating film 27 are stacked in this order provided over the oxide semiconductor film 41, the conductive film 43, the conductive film 44, the metal oxide film 42, and the conductive film 61. The transistor 56 may include the insulating films 26 and 27. Although the insulating films 26 and 27, which are stacked in this order, are illustrated in FIG. 12, a single insulating film or a stack of three or more insulating films may be used instead of the insulating films 26 and 27.

An opening 58 is provided in the insulating films 26 and 27 to overlap with the metal oxide film 42. The opening 58 is provided in a region overlapping with the metal oxide film 42, and the oxide semiconductor film 41, the conductive film 43, and the conductive film 44 are not provided in the region.

In FIG. 12, a nitride insulating film 28 and an insulating film 29 are stacked in this order over the insulating film 26 and the insulating film 27 and over the metal oxide film 42 in the opening 58.

Note that by forming an oxide semiconductor film over the insulating film 22 and forming the nitride insulating film 28 to be in contact with the oxide semiconductor film, the conductivity of the oxide semiconductor film can be increased. In that case, the oxide semiconductor film with high conductivity can be used as the metal oxide film 42. The conductivity of the oxide semiconductor film is increased probably because oxygen vacancies are formed in the oxide semiconductor film at the time of forming the opening 58 or the nitride insulating film 28, and hydrogen diffused from the nitride insulating film 28 is bonded to the oxygen vacancies to form a donor. Specifically, the resistivity of the metal oxide film 42 is higher than or equal to $1\times10^{-3}$ Ωcm and lower than $1\times10^{4}$ Ωcm, preferably higher than or equal to $1\times10^{-3}$ Ωcm and lower than $1\times10^{-1}$ Ωcm.

It is preferable that the metal oxide film 42 have a higher hydrogen concentration than the oxide semiconductor film 41. In the metal oxide film 42, the hydrogen concentration measured by secondary ion mass spectrometry (SIMS) is greater than or equal to $8\times10^{19}$ atoms/cm$^3$, preferably greater than or equal to $1\times10^{20}$ atoms/cm$^3$, more preferably greater than or equal to $5\times10^{20}$ atoms/cm$^3$. In the oxide semiconductor film 41, the hydrogen concentration measured by SIMS is less than $5\times10^{19}$ atoms/cm$^3$, preferably less than $5\times10^{18}$ atoms/cm$^3$, further preferably less than or equal to $1\times10^{18}$ atoms/cm$^3$, still further preferably less than or equal to $5\times10^{17}$ atoms/cm$^3$, yet still further preferably less than or equal to $1\times10^{16}$ atoms/cm$^3$.

For the nitride insulating film 28, silicon nitride, silicon nitride oxide, aluminum nitride, or aluminum nitride oxide can be used, for example. In comparison with an oxide insulating film such as a silicon oxide film and an aluminum oxide film, the nitride insulating film 28 containing any of the above materials can further prevent impurities from outside, such as water, alkali metal, and alkaline-earth metal, from being diffused into the oxide semiconductor film 41.

Furthermore, an opening 62 is provided in the nitride insulating film 28 and the insulating film 29 to overlap with the conductive film 44. A conductive film 45 that transmits visible light and serves as a pixel electrode is provided over the nitride insulating film 28 and the insulating film 29. The conductive film 45 is electrically connected to the conductive film 44 in the opening 62. The conductive film 45 overlaps with the metal oxide film 42 in the opening 58. A portion where the conductive film 45 and the metal oxide film 42 overlap with each other with the nitride insulating film 28 and the insulating film 29 sandwiched therebetween serves as the capacitor 57.

In the capacitor 57, the metal oxide film 42 and the conductive film 45 serving as a pair of electrodes and the nitride insulating film 28 and the insulating film 29 collectively serving as a dielectric film transmit visible light. This means that the capacitor 57 transmits visible light. Thus, the aperture ratio of the pixel 55 can be higher than that of a pixel including a capacitor having a property of transmitting less visible light. Therefore, the required capacitance for high image quality can be secured and the aperture ratio of the pixel can be increased; thus, light loss can be reduced in a panel and power consumption of a semiconductor device can be reduced.

Note that as described above, the insulating film 29 is not necessarily provided. However, with the use of the insulating film 29 using an insulator, which has a dielectric constant lower than that of the nitride insulating film 28, as a dielectric film together with the nitride insulating film 28, the dielectric constant of the dielectric film of the capacitor 57 can be adjusted to a desired value without increasing the thickness of the nitride insulating film 28.

An alignment film 52 is provided over the conductive film 45.

A substrate 46 is provided to face the substrate 31. A shielding film 47 blocking visible light and a coloring layer 48 transmitting visible light in a specific wavelength range are provided on the substrate 46. A resin film 50 is provided on the shielding film 47 and the coloring layer 48, and a conductive film 59 serving as a common electrode is provided on the resin film 50. An alignment film 51 is provided on the conductive film 59.

Between the substrates 31 and 46, a liquid crystal layer 53 containing a liquid crystal material is sandwiched between the alignment films 52 and 51. The liquid crystal element 60 includes the conductive film 45, the conductive film 59, and the liquid crystal layer 53.

Although a twisted nematic (TN) mode is used as a method for driving the liquid crystal in FIG. 11 and FIG. 12, the following can be used as a method for driving the liquid crystal: a fringe field switching (FFS) mode, a super twisted nematic (STN) mode, a vertical alignment (VA) mode, a multi-domain vertical alignment (MVA) mode, an in-plane-switching (IPS) mode, an optically compensated birefringence (OCB) mode, a blue phase mode, a transverse bend alignment (TBA) mode, a VA-IPS mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, an advanced super view (ASV) mode, and the like.

In the liquid crystal display device of one embodiment of the present invention, the liquid crystal layer can be formed using, for example, a liquid crystal material classified into a thermotropic liquid crystal or a lyotropic liquid crystal. As another example of a liquid crystal material used for the liquid crystal layer, the following can be given: a nematic liquid crystal, a smectic liquid crystal, a cholesteric liquid crystal, or a discotic liquid crystal. Further alternatively, a liquid crystal material categorized by a ferroelectric liquid crystal or an anti-ferroelectric liquid crystal can be used. Further alternatively, a liquid crystal material categorized by a high-molecular liquid crystal such as a main-chain high-molecular liquid crystal, a side-chain high-molecular liquid crystal, or a composite-type high-molecular liquid crystal, or a low-molecular liquid crystal can be used. Further alternatively, a liquid crystal material categorized by a polymer dispersed liquid crystal (PDLC) can be used.

Alternatively, liquid crystal exhibiting a blue phase for which an alignment film is unnecessary may be used for the liquid crystal layer. A blue phase is one of liquid crystal phases, which is generated just before a cholesteric phase changes into an isotropic phase while temperature of cholesteric liquid crystal is increased. Since the blue phase is only generated within a narrow range of temperature, a chiral material or an ultraviolet curable resin is added so that the temperature range is improved. The liquid crystal composition that includes a liquid crystal exhibiting a blue phase and a chiral material is preferable because it has a small response time of less than or equal to 1 msec, has optical isotropy, which makes the alignment process unneeded, and has a small viewing angle dependence.

Although a liquid crystal display device using a color filter to display a color image is illustrated in FIG. 12 as an example, the liquid crystal display device of one embodiment of the present invention may display a color image by sequentially lighting a plurality of light sources having different hues.

Figure 13A:
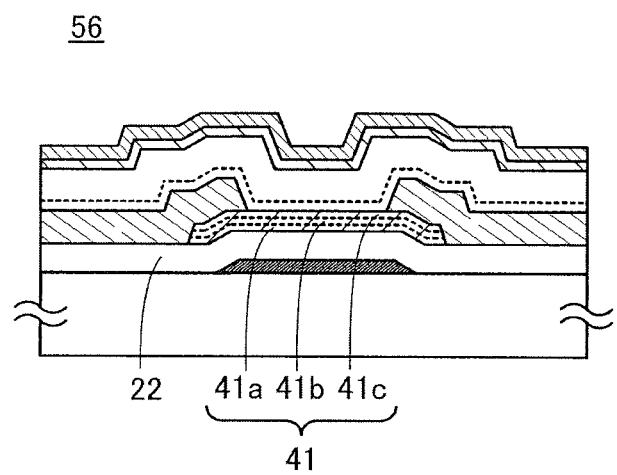
FIGS. 13A and 13B are cross-sectional views illustrating a structure of a transistor.

The oxide semiconductor film 41 of the transistor 56 is not necessarily a single oxide semiconductor film, but may be a stack of a plurality of oxide semiconductor films. FIG. 13A illustrates an example in which the oxide semiconductor film 41 is formed using a stack of three oxide semiconductor films. Specifically, in the transistor 56 in FIG. 13A, oxide semiconductor films 41a, 41b, and 41c are stacked sequentially from the insulating film 22 side as the oxide semiconductor film 41.

The oxide semiconductor films 41a and 41c each contains at least one of metal elements contained in the oxide semiconductor film 41b. The energy at the bottom of the conduction band of the oxide semiconductor films 41a and 41c is closer to a vacuum level than that of the oxide semiconductor film 41b by 0.05 eV or more, 0.07 eV or more, 0.1 eV or more, or 0.15 eV or more and 2 eV or less, 1 eV or less, 0.5 eV or less, or 0.4 eV or less. Further, the oxide semiconductor film 41b preferably contains at least indium in order that the carrier mobility is high.

Figure 13B:
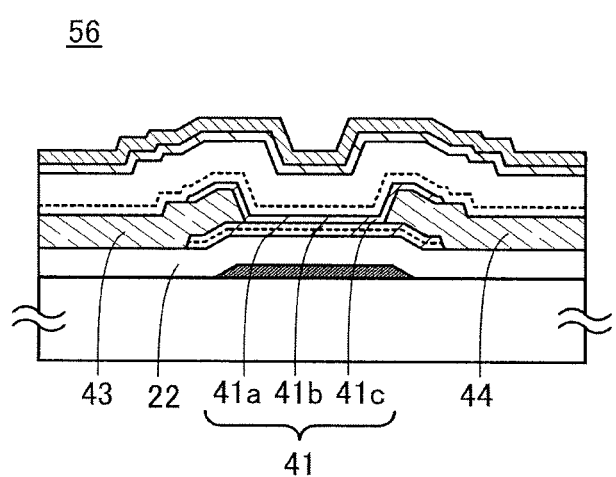

As illustrated in FIG. 13B, the oxide semiconductor film 41c overlapping with the insulating film 22 may be provided over the conductive films 43 and 44.

<Top and Cross-Sectional Views of Semiconductor Display Device>

Figure 14:
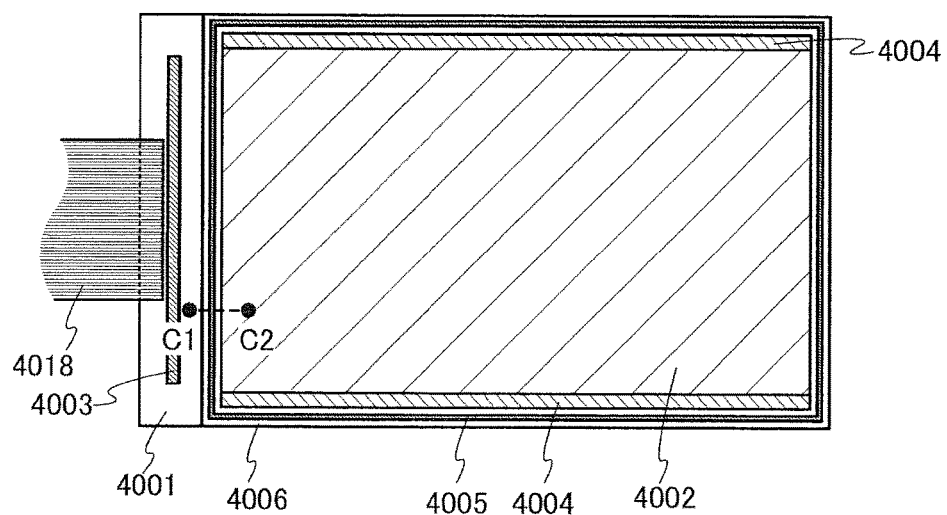
FIG. 14 is a top view of a liquid crystal display device.
Figure 15:
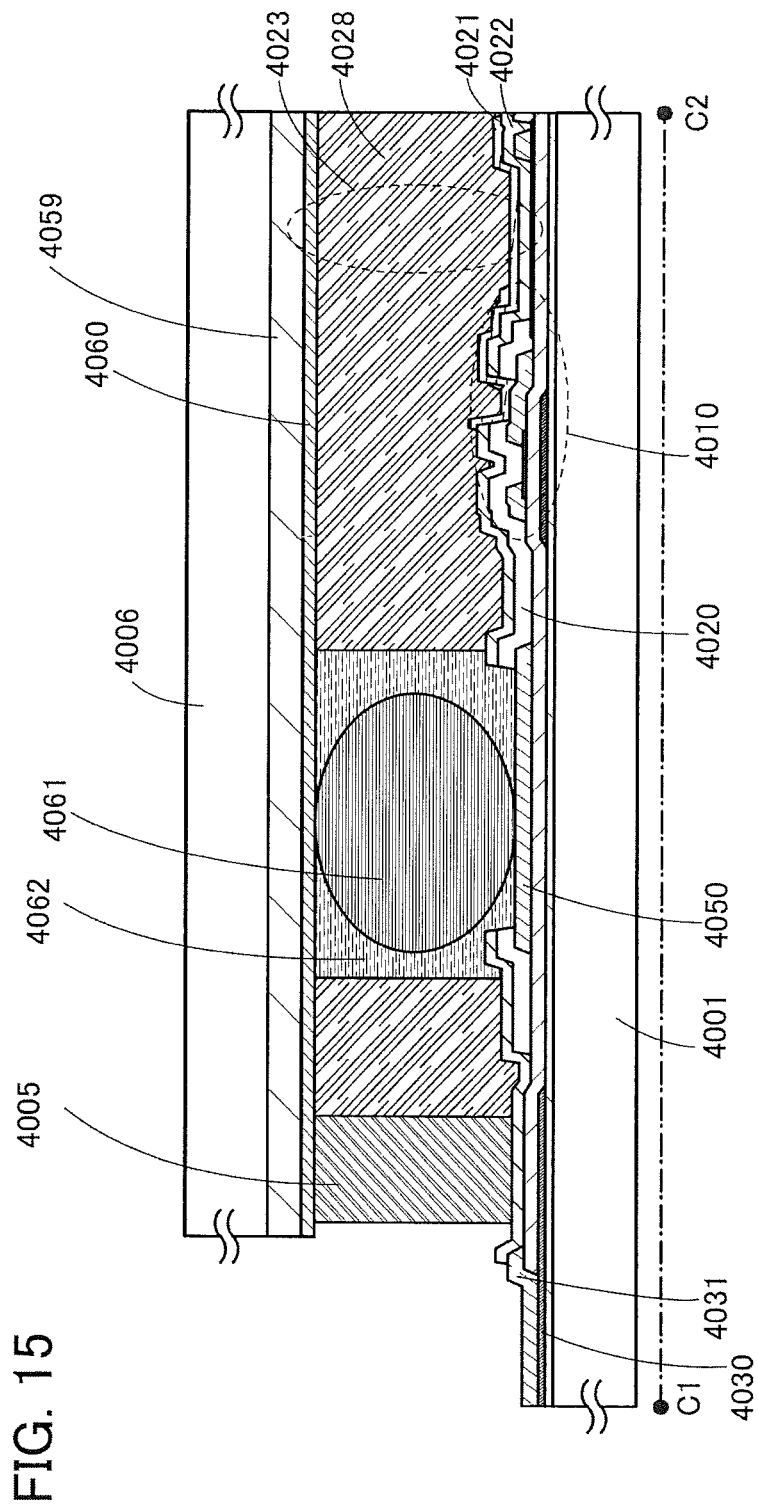
FIG. 15 is a cross-sectional view of a liquid crystal display device.

The appearance of a semiconductor display device of one embodiment of the present invention is described with reference to FIG. 14. FIG. 14 is a top view of a liquid crystal display device where a substrate 4001 and a substrate 4006 are bonded to each other with a sealant 4005. FIG. 15 corresponds to a cross-sectional view taken along dashed line C1-C2 in FIG. 14.

The sealant 4005 is provided to surround a pixel portion 4002 and a pair of driver circuits 4004 provided over the substrate 4001. The substrate 4006 is provided over the pixel portion 4002 and the driver circuits 4004. Thus, the pixel portion 4002 and the driver circuits 4004 are sealed by the substrate 4001, the sealant 4005, and the substrate 4006.

A driver circuit 4003 is mounted in a region that is different from the region surrounded by the sealant 4005 over the substrate 4001.

A plurality of transistors are included in the pixel portion 4002 and the driver circuits 4004 provided over the substrate 4001. FIG. 15 illustrates a transistor 4010 included in the pixel portion 4002. An insulating film 4020 that can be formed using a variety of insulating films including an oxide insulating film and an insulating film 4022 that can be formed using a variety of insulating films including a nitride insulating film are provided over the transistor 4010. The transistor 4010 is connected to a pixel electrode 4021 over the insulating film 4022 in an opening portion provided in the insulating films 4020 and 4022.

A resin film 4059 is provided on the substrate 4006, and a common electrode 4060 is provided on the resin film 4059. A liquid crystal layer 4028 between the pixel electrode 4021 and the common electrode 4060 is provided between the substrates 4001 and 4006. A liquid crystal element 4023 includes the pixel electrode 4021, the common electrode 4060, and the liquid crystal layer 4028.

The transmittance of the liquid crystal element 4023 changes when the alignment of liquid crystal molecules included in the liquid crystal layer 4028 changes in accordance with the level of a voltage applied between the pixel electrode 4021 and the common electrode 4060. Accordingly, when the transmittance of the liquid crystal element 4023 is controlled by the potential of a video signal supplied to the pixel electrode 4021, gray-scale images can be displayed.

As illustrated in FIG. 15, in one embodiment of the present invention, the insulating films 4020 and 4022 are removed at an end portion of the panel. A conductive film 4050 is formed in the region where the insulating films 4020 and 4022 are removed. The conductive film 4050 and a conductive film serving as a source or a drain of the transistor 4010 can be formed by etching one conductive film.

A resin film 4062 in which conductive particles 4061 having conductivity are dispersed is provided between the substrate 4001 and the substrate 4006. The conductive film 4050 is electrically connected to the common electrode 4060 through the conductive particles 4061. In other words, the common electrode 4060 and the conductive film 4050 are electrically connected to each other through the conductive particle 4061 at the end portion of the panel. The resin film 4062 can be formed using a thermosetting resin or an ultraviolet curable resin. As the conductive particle 4061, a particle of a spherical organic resin coated with thin-film metal of Au, Ni, Co, or the like can be used, for example.

An alignment film is not illustrated in FIG. 15. In the case of providing alignment films on the pixel electrode 4021 and the common electrode 4060, the alignment film on the common electrode 4060 is partly removed and the alignment film on the conductive film 4050 is partly removed; thus, electrical connection can be obtained among the common electrode 4060, the conductive particle 4061, and the conductive film 4050.

Note that in the liquid crystal display device of one embodiment of the present invention, a color image may be displayed by using a color filter or by sequentially turning on a plurality of light sources emitting light with different hues.

Video signals from the driver circuit 4003 and a variety of control signals and potentials from an FPC 4018 are supplied to the driver circuits 4004 or the pixel portion 4002 through lead wirings 4030 and 4031.

<Semiconductor Film>

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely low off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove low off-state current of a transistor having a channel formation region in a highly purified oxide semiconductor film. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at a voltage (drain voltage) between the source electrode and the drain electrode of 1 V to 10 V. In that case, it can be seen that off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor film was used for a channel formation region of the transistor, and the off-state current of the transistor was measured from a change in the amount of charge of the capacitor per unit hour. As a result, it was found that, in the case where the voltage between the source electrode and the drain electrode of the transistor is 3 V, a lower off-state current of several tens of yA/μm is obtained. Accordingly, the off-state current of the transistor in which the highly purified oxide semiconductor film is used as a channel formation region is considerably lower than that of a transistor in which silicon having crystallinity is used.

In the case where an oxide semiconductor film is used as a semiconductor film, an oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn-based oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Ce—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, with an In—Sn—Zn-based oxide, high mobility can be relatively easily obtained. However, even with an In—Ga—Zn-based oxide, mobility can be increased by lowering defect density in the bulk.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a CAAC-OS film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, a change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) that exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is higher than or equal to 100° C. and lower than or equal to 740° C., preferably higher than or equal to 200° C. and lower than or equal to 500° C. When the substrate heating temperature during the deposition is increased and flat-plate-like or pellet-like sputtered particles reach the substrate, migration occurs on the substrate, so that a flat plane of each sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn-based oxide target is described below.

The In—Ga—Zn-based oxide target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. to and lower than or equal to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

An alkali metal is not an element included in an oxide semiconductor and thus is an impurity. Also, alkaline earth metal is an impurity in the case where the alkaline earth metal is not a component of the oxide semiconductor. Alkali metal, in particular, Na becomes Na when an insulating film in contact with the oxide semiconductor film is an oxide and Na diffuses into the insulating film. Further, in the oxide semiconductor film, Na cuts or enters a bond between metal and oxygen which are components of the oxide semiconductor. As a result, the electrical characteristics of the transistor deteriorate, for example, the transistor is placed in a normally-on state because of a negative shift of the threshold voltage or the mobility is decreased. In addition, the characteristics of transistors vary. Specifically, the Na concentration measured by secondary ion mass spectrometry is preferably 5×10$^{16}$/cm$^3$ or lower, further preferably 1×10$^{16}$/cm$^3$ or lower, still further preferably 1×10$^{15}$/cm$^3$ or lower. Similarly, the measured Li concentration is preferably 5×10$^{15}$/cm$^3$ or lower, further preferably 1×10$^{15}$/cm$^3$ or lower. Similarly, the measured K concentration is preferably $5 \times 10^{15}/cm^3$ or lower, further preferably $1 \times 10^{15}/cm^3$ or lower.

In the case where metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor film, the electrical characteristics of the transistor are likely to deteriorate as in the case of using alkali metal or alkaline earth metal. Thus, the concentrations of silicon and carbon in the oxide semiconductor film are preferably low. Specifically, the C concentration or the Si concentration measured by secondary ion mass spectrometry is preferably less than or equal to $1 \times 10^{18}/cm^3$. In this case, the deterioration of the electrical characteristics of the transistor can be prevented, so that the reliability of a semiconductor device can be improved.

A metal in the source and drain electrodes might extract oxygen from the oxide semiconductor film depending on a conductive material used for the source and drain electrodes. In such a case, regions of the oxide semiconductor film in contact with the source and drain electrodes become n-type regions because of the formation of an oxygen vacancy.

The n-type regions serve as source and drain regions, resulting in a decrease in the contact resistance between the oxide semiconductor film and the source electrode or the drain electrode. Accordingly, the formation of the n-type regions increases the mobility and the on-state current of the transistor, which achieves high-speed operation of a semiconductor device using the transistor.

Note that the extraction of oxygen by a metal in the source and drain electrodes is probably caused when the source and drain electrodes are formed by a sputtering method or when heat treatment is performed after the formation of the source and drain electrodes.

The n-type regions are more likely to be formed when the source and drain electrodes are formed using a conductive material that is easily bonded to oxygen. Examples of such a conductive material include Al, Cr, Cu, Ta, Ti, Mo, and W.

The oxide semiconductor film is not limited to a single-layer metal oxide film and may have a stacked structure of a plurality of metal oxide films. In a semiconductor film in which first to third metal oxide films are stacked in this order, for example, the first metal oxide film and the third metal oxide film are each an oxide film that contains at least one of the metal elements contained in the second metal oxide film and whose conduction band minimum is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Furthermore, the second metal oxide film preferably contains at least indium, in which case the carrier mobility of the second metal oxide film is increased.

In the transistor including the above oxide semiconductor film, when a voltage is applied to the gate electrode so that an electric field is applied to the semiconductor film, a channel region is formed in the second metal oxide film whose conduction band minimum is small in the semiconductor film. That is, since the third metal oxide film is provided between the second metal oxide film and the gate insulating film, a channel region can be formed in the second metal oxide film that is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, resulting in an increase in the field-effect mobility of the transistor.

When an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be forming at the interface between the second metal oxide film and the first metal oxide film. Accordingly, the above structure can reduce variations in the electrical characteristics of the transistor, such as the threshold voltage.

Further, a plurality of metal oxide films are preferably stacked so that an interface level that inhibits carrier flow is not formed at the interface between the metal oxide films due to an impurity existing between the metal oxide films. This is because when an impurity exists between the stacked metal oxide films, the continuity of the conduction band minimum between the metal oxide films is lost, and carriers are trapped or disappear by recombination in the vicinity of the interface. By reducing an impurity existing between the films, a continuous junction (here, particularly a U-shape well structure whose conduction band minimum is changed continuously between the films) is formed more easily than the case of merely stacking a plurality of metal oxide films that contain at least one common metal as a main component.

In order to form such a continuous junction, the films need to be stacked successively without being exposed to the air by using a multi-chamber deposition system (sputtering system) provided with a load lock chamber. Each chamber of the sputtering apparatus is preferably evacuated to a high vacuum (to approximately $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the sputtering gas has a dew point of $-40°$ C. or lower, preferably $-80°$ C. or lower, further preferably $-100°$ C. or lower and is highly purified, moisture and the like can be prevented from entering the oxide semiconductor film as much as possible. Specifically, when the second metal oxide film is an In-M-Zn oxide film (M is Ga, Y, Zr, La, Ce, or Nd) and a target having an atomic ratio of metal elements of In:M:Zn=$x_1$:$y_1$:$z_1$ is used to form the second metal oxide film, $x_1/y_1$ ranges preferably from 1/3 to 6, further preferably from 1 to 6, and $z_1/y_1$ ranges preferably from 1/3 to 6, further preferably from 1 to 6. Note that when $z_1/y_1$ ranges from 1 to 6, a CAAC-OS film is likely to be formed as the second metal oxide film. Typical examples of the atomic ratio of the metal elements in the target are In:M:Zn=1:1:1 and In:M:Zn=3:1:2.

Specifically, when the first and third metal oxide films are each an In-M-Zn oxide film (M is Ga, Y, Zr, La, Ce, or Nd) and a target used for depositing the first and third metal oxide films has an atomic ratio of metal elements of In:M:Zn=$x_2$:$y_2$:$z_2$, $x_2/y_2 < x_1/y_1$ is satisfied and $z_2/y_2$ ranges preferably from 1/3 to 6, further preferably from 1 to 6. Note that when $z_2/y_2$ ranges from 1 to 6, CAAC-OS films are likely to be formed as the first and third metal oxide films. Typical examples of the atomic ratio of the metal elements of the target are In:M:Zn=1:3:2, In:M:Zn=1:3:4, In:M:Zn=1:3:6, In:M:Zn=1:3:8, and the like.

The first and third metal oxide films each have a thickness of 3 nm to 100 nm, preferably 3 nm to 50 nm. The second metal oxide film has a thickness of 3 nm to 200 nm, preferably 3 nm to 100 nm, further preferably 3 nm to 50 nm.

In the three-layer semiconductor film, each of the first to third metal oxide films can be amorphous or crystalline. Note that the second metal oxide film in which a channel region is formed is preferably crystalline, in which case the transistor can have stable electrical characteristics.

Note that a "channel formation region" refers to a region of a semiconductor film of a transistor that overlaps with a gate electrode and is located between a source electrode and a drain electrode. Further, a "channel region" refers to a region through which current mainly flows in the channel formation region.

For example, when an In—Ga—Zn-based oxide film formed by a sputtering method is used as each of the first and third metal oxide films, the first and third metal oxide films can be deposited with use of an In—Ga—Zn-based oxide target containing In, Ga, and Zn in an atomic ratio of 1:3:2. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the second metal oxide film is a CAAC-OS film, the second metal oxide film is preferably deposited with use of a polycrystalline In—Ga—Zn-based oxide target containing In, Ga, and Zn in an atomic ratio of 1:1:1. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the end portion of the semiconductor film included in the transistor may be inclined or may be rounded.

Also in the case where a semiconductor film including stacked metal oxide films is used in the transistor, a region in contact with the source electrode or the drain electrode can be an n-type region. Such a structure increases the mobility and the on-state current of the transistor and achieves high-speed operation of a semiconductor device using the transistor. Furthermore, when the semiconductor film including the stacked metal oxide films is used in the transistor, the n-type region particularly preferably reaches the second metal oxide film part of which is to be a channel region, because the mobility and the on-state current of the transistor are further increased and higher-speed operation of the semiconductor device is achieved.

<Structure Example of Electronic Device Using Semiconductor Device>

The semiconductor device of one embodiment of the present invention can be used for display devices, personal computers, or image reproducing devices provided with recording media (typically, devices that include displays, and can reproduce the content of recording media such as digital versatile discs (DVDs) and display the reproduced images). In addition, examples of electronic devices in which the semiconductor device of one embodiment of the present invention can be used include cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), and vending machines. Specific examples of these electronic devices are illustrated in FIGS. 16A to 16F.

Figure 16A:
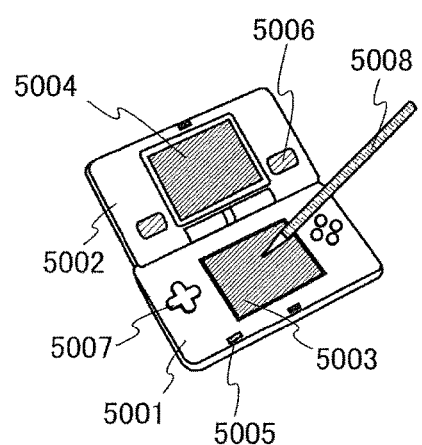
FIGS. 16A to 16F each illustrate an electronic device.

FIG. 16A illustrates a portable game machine, which includes a housing 5001, a housing 5002, a display portion 5003, a display portion 5004, a microphone 5005, speakers 5006, an operation key 5007, a stylus 5008, and the like. The semiconductor device of one embodiment of the present invention can be used for the display portion 5003, the display portion 5004, or an integrated circuit in another portion. Note that although the portable game machine in FIG. 16A has the two display portions 5003 and 5004, the number of display portions included in the portable game machine is not limited thereto.

Figure 16B:
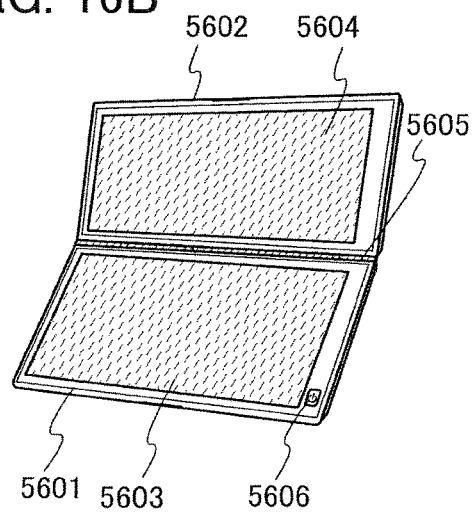

FIG. 16B illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. Images on the first display portion 5603 may be switched in accordance with the angle at the joint 5605 between the first housing 5601 and the second housing 5602. The semiconductor device of one embodiment of the present invention can be used for the first display portion 5603, the second display portion 5604, or an integrated circuit in another portion.

Figure 16C:
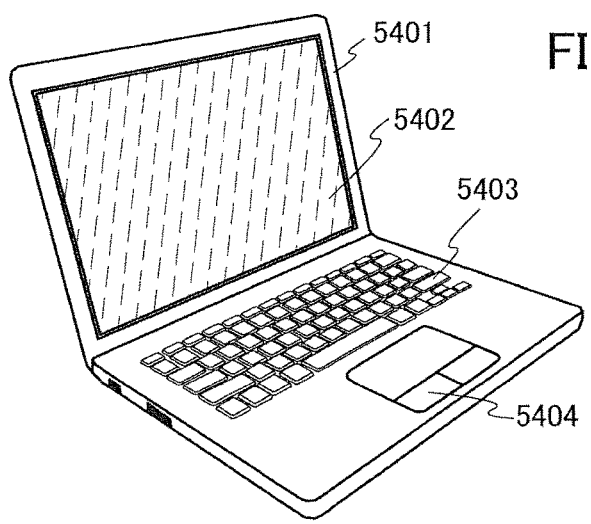

FIG. 16C illustrates a laptop personal computer, which includes a housing 5401, a display portion 5402, a keyboard 5403, a pointing device 5404, and the like. The semiconductor device of one embodiment of the present invention can be used for the display portion 5402 or an integrated circuit in another portion.

Figure 16D:
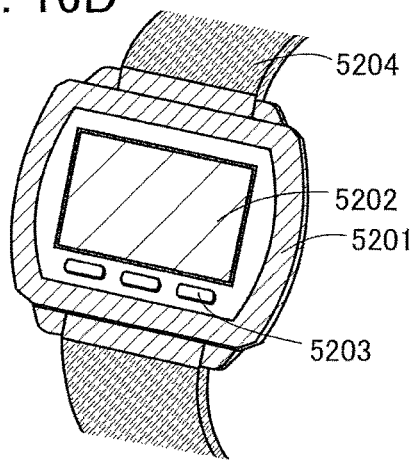

FIG. 16D illustrates a wristwatch, which includes a housing 5201, a display portion 5202, an operation button 5203, a bracelet 5204, and the like. The semiconductor device of one embodiment of the present invention can be used for the display portion 5202 or an integrated circuit in another portion.

Figure 16E:
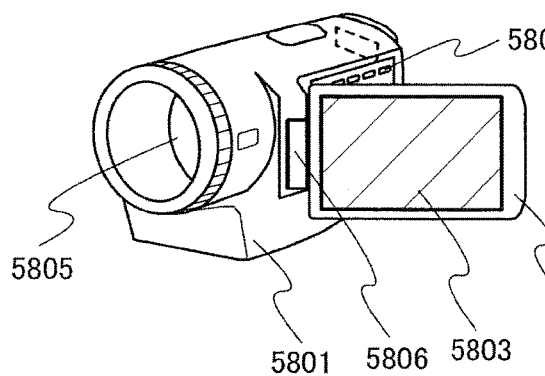

FIG. 16E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 is connected to the second housing 5802 with the joint 5806, and the angle between the first housing 5801 and the second housing 5802 can be changed at the joint 5806. Images on the display portion 5803 may be switched in accordance with the angle at the joint 5806 between the first housing 5801 and the second housing 5802. The semiconductor device of one embodiment of the present invention can be used for the display portion 5803 or an integrated circuit in another portion.

Figure 16F:
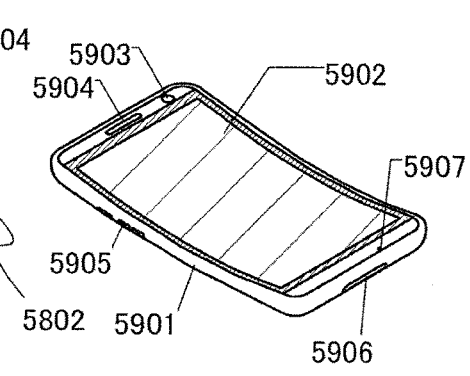

FIG. 16F illustrates a cellular phone. In the cellular phone, a display portion 5902, a microphone 5907, a speaker 5904, a camera 5903, an external connection portion 5906, and an operation button 5905 are provided in a housing 5901. The semiconductor device of one embodiment of the present invention can be used for the display portion 5902 or an integrated circuit in another portion. When the semiconductor device of one embodiment of the present invention is provided over a flexible substrate, the semiconductor device can be used as the display portion 5902 having a curved surface, as illustrated in FIG. 16F.

This application is based on Japanese Patent Application serial No. 2013-144190 filed with Japan Patent Office on Jul. 10, 2013, the entire contents of which are hereby incorporated by reference.

What is claimed is:

1. A semiconductor device comprising:
a pixel portion;
a first sequential circuit;
a second sequential circuit; and
a bus line configured to supply an output signal of the first sequential circuit to the pixel portion,
wherein the first sequential circuit comprises:
a first output terminal electrically connected to the second sequential circuit;
a second output terminal electrically connected to the bus line;
a first transistor;
a second transistor;
a third transistor;
a fourth transistor;
a fifth transistor;
a sixth transistor;
a first wiring supplied with a first potential;
a second wiring supplied with a second potential; and
a third wiring supplied with a third potential,
wherein one of a source and a drain of the first transistor is electrically connected to one of a source and a drain of the second transistor,
wherein a gate of the third transistor is electrically connected to a gate of the first transistor,
wherein one of a source and a drain of the third transistor is electrically connected to one of a source and a drain of the fourth transistor,
wherein one of a source and a drain of the fifth transistor is electrically connected to a gate of the second transistor,
wherein the other of the source and the drain of the fifth transistor is electrically connected to the one of the source and the drain of the third transistor and the one of the source and the drain of the fourth transistor,
wherein the other of the source and the drain of the third transistor is electrically connected to the first wiring,
wherein the other of the source and the drain of the first transistor is electrically connected to the second wiring,
wherein the other of the source and the drain of the fourth transistor is electrically connected to the third wiring,
wherein a gate of the fifth transistor is electrically connected to the third wiring,
wherein the second potential is higher than the first potential,
wherein the third potential is higher than the second potential,
wherein each of the first transistor, the second transistor, the third transistor, the fourth transistor and the fifth transistor is an n-channel transistor,
wherein one of a source and a drain of the second transistor is electrically connected to the bus line, and the other of the source and the drain is configured to be supplied with a first clock signal,
wherein one of a source and a drain of the sixth transistor is electrically connected to the first output terminal, and the other of the source and the drain of the sixth transistor is configured to be supplied with a second clock signal,
wherein the second transistor and the sixth transistor are n-channel transistors,
wherein the low-level potential of the first clock signal is higher than the low-level potential of the second clock signal, and
wherein the high-level potential of the first clock signal is higher than the high-level potential of the second clock signal.

2. A display device comprising:
a pixel portion;
a first sequential circuit;
a second sequential circuit; and
a bus line configured to supply an output signal of the first sequential circuit to the pixel portion,
wherein the first sequential circuit comprises a first output terminal electrically connected to the second sequential circuit, a second output terminal electrically connected to the bus line, a first transistor and a second transistor,
wherein one of a source and a drain of the first transistor is electrically connected to the bus line, and the other of the source and the drain is configured to be supplied with a first clock signal;
wherein one of a source and a drain of the second transistor is electrically connected to the first output terminal, and the other of the source and the drain of the second transistor is configured to be supplied with a second clock signal,
wherein the first transistor and the second transistor are n-channel transistors,
wherein the low-level potential of the first clock signal is higher than the low-level potential of the second clock signal, and
wherein the high-level potential of the first clock signal is higher than the high-level potential of the second clock signal.

3. A display device according to claim 2 wherein the display device is a liquid crystal device.

4. A display device according to claim 2 wherein the display device is a light emitting device.

5. A display device according to claim 2 wherein the first transistor is normally on.

6. A display device according to claim 2 wherein a channel region of the first transistor and the second transistor comprises an oxide semiconductor.

7. A display device according to claim 6 wherein the oxide semiconductor comprises In, Ga, and Zn.

* * * * *